(12) United States Patent
Ishida et al.

(10) Patent No.: US 6,917,639 B2
(45) Date of Patent: Jul. 12, 2005

(54) LASER DRIVER CIRCUIT

(75) Inventors: Masaaki Ishida, Yokosuka (JP);
Hidetoshi Ema, Yokohama (JP);
Yasuhiro Nihei, Yokohama (JP);
Hiroaki Kyougoku, Toyonaka (JP);
Atsufumi Omori, Chigasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/214,559

(22) Filed: Aug. 9, 2002

(65) Prior Publication Data

US 2003/0035451 A1 Feb. 20, 2003

(30) Foreign Application Priority Data

Aug. 9, 2001 (JP) ........................... 2001-242523
Sep. 21, 2001 (JP) ........................... 2001-288516
May 29, 2002 (JP) ........................... 2002-155773

(51) Int. Cl.$^7$ ............................. H01S 3/00; H01S 3/13
(52) U.S. Cl. .................... 372/38.02; 372/38.07; 372/29.015
(58) Field of Search ................. 372/38.1, 38.02, 372/38.04, 38.07, 29.012, 29.015

(56) References Cited

U.S. PATENT DOCUMENTS

| | | | | |
|---|---|---|---|---|
| 3,925,735 A | * | 12/1975 | Ozeki et al. | 372/38.07 |
| 4,339,822 A | * | 7/1982 | Kolodzey | 372/38.1 |
| 4,347,610 A | * | 8/1982 | Meuleman | 372/38.07 |
| 4,677,632 A | * | 6/1987 | Lisco et al. | 372/29.015 |
| 4,985,896 A | * | 1/1991 | Kimizuka et al. | 372/38.02 |
| 5,027,362 A | * | 6/1991 | Hokanson et al. | 372/38.07 |
| 5,036,519 A | | 7/1991 | Ema et al. | |
| 5,043,992 A | * | 8/1991 | Royer et al. | 372/38.1 |
| 5,050,177 A | | 9/1991 | Ema et al. | |
| 5,138,623 A | | 8/1992 | Ema et al. | |
| 5,153,765 A | * | 10/1992 | Grunziger | 372/38.07 |

(Continued)

OTHER PUBLICATIONS

U.S. Appl. No. 09/678,611, filed Oct. 4, 2000, Sakai et al.
U.S. Appl. No. 09/716,949, filed Nov. 22, 2000, Atsuumi et al.
U.S. Appl. No. 09/788,415, filed Feb. 21, 2001, Sakai et al.
U.S. Appl. No. 09/816,378, filed Mar. 26, 2001, Suzuki et al.
U.S. Appl. No. 10/028,698, filed Dec. 28, 2001, Hayashi.
U.S. Appl. No. 10/047,698, filed Jan. 18, 2002, Suzuki.
U.S. Appl. No. 10/059,371, filed Jan. 31, 2002, Ono.
U.S. Appl. No. 10/047,092, filed Jan. 17, 2002, Atsuumi.
U.S. Appl. No. 10/143,013, filed May 13, 2002, Suhara et al.
U.S. Appl. No. 10/161,659, filed Jun. 5, 2002, Suzuki et al.
U.S. Appl. No. 10/161,756, filed Jun. 5, 2002, Atsuumi et al.
U.S. Appl. No. 10/183,748, filed Jun. 28, 2002, Nihei et al.
U.S. Appl. No. 10/207,241, filed Jul. 30, 2002, Suzuki et al.
U.S. Appl. No. 10/323,837, filed Dec. 20, 2002, Suzuki et al.
U.S. Appl. No. 10/109,696, filed Apr. 1, 2002.
U.S. Appl. No. 09/559,409, filed Apr. 25, 2000, Allowed.

(Continued)

*Primary Examiner*—Minsun Harvey
*Assistant Examiner*—James Menefee
(74) *Attorney, Agent, or Firm*—Oblon, Spivak, McClelland, Maier & Neustadt, P.C.

(57) ABSTRACT

A laser driver circuit includes a biasing current source, a threshold current source, and a modulation current source, wherein the threshold current source produces a threshold current in response to an input signal with an interval exceeding an interval of a modulation current such that said interval of the threshold current includes the interval of said modulation current. The laser driver circuit drives the laser diode by a sum of a continuous bias current, the threshold current and the modulation current.

31 Claims, 37 Drawing Sheets

U.S. PATENT DOCUMENTS

| | | | | |
|---|---|---|---|---|
| 5,237,579 A | | 8/1993 | Ema et al. | |
| 5,258,780 A | | 11/1993 | Ema et al. | |
| 5,309,269 A | * | 5/1994 | Shibao | 372/38.07 |
| 5,325,160 A | | 6/1994 | Imakawa et al. | |
| 5,500,867 A | * | 3/1996 | Krasulick | 372/38.02 |
| 5,651,017 A | * | 7/1997 | Genovese | 372/38.02 |
| 5,675,599 A | * | 10/1997 | Abe et al. | 372/38.07 |
| 5,754,577 A | * | 5/1998 | Casper et al. | 372/38.07 |
| 5,784,091 A | | 7/1998 | Ema et al. | |
| 5,844,928 A | * | 12/1998 | Shastri et al. | 372/38.02 |
| 5,946,334 A | | 8/1999 | Ema et al. | |
| 6,055,252 A | * | 4/2000 | Zhang | 372/38.02 |
| 6,118,798 A | | 9/2000 | Ema et al. | |
| 6,233,081 B1 | | 5/2001 | Suzuki et al. | |
| 6,359,717 B2 | | 3/2002 | Suzuki et al. | |
| 6,370,175 B1 | * | 4/2002 | Ikeda et al. | 372/38.1 |
| 6,376,837 B1 | | 4/2002 | Itabashi et al. | |
| 6,384,949 B1 | | 5/2002 | Suzuki | |
| 6,388,792 B1 | | 5/2002 | Atsuumi et al. | |
| 6,400,391 B1 | | 6/2002 | Suhara et al. | |
| 6,417,509 B1 | | 7/2002 | Atsuumi et al. | |
| 6,448,998 B1 | | 9/2002 | Suzuki et al. | |
| 6,509,995 B1 | | 1/2003 | Suzuki et al. | |
| 6,560,258 B1 | * | 5/2003 | McQuilkin | 372/38.02 |
| 2002/0080428 A1 | | 6/2002 | Suzuki et al. | |
| 2002/0101642 A1 | | 8/2002 | Masuda | |
| 2002/0114365 A1 | * | 8/2002 | Gilliland et al. | 372/38.02 |
| 2002/0141466 A1 | * | 10/2002 | Martinez et al. | 372/38.02 |

OTHER PUBLICATIONS

U.S. Appl. No. 09/689,790, filed Oct. 13, 2000, Pending.
U.S. Appl. No. 09/797,574, filed Mar. 5, 2001, Pending.
U.S. Appl. No. 09/873,256, filed Jun. 5, 2001, Pending.
U.S. Appl. No. 10/095,913, filed Mar. 13, 2002, Pending.
U.S. Appl. No. 10/820,733, filed Apr. 9, 2004, Suhara et al.
U.S. Appl. No. 10/771,521, filed Feb. 5, 2004, Nihei et al.
U.S. Appl. No. 10/409,143, filed Apr. 9, 2003, Ozasa et al.
U.S. Appl. No. 10/435,034, filed May 12, 2003, Nihei et al.
U.S. Appl. No. 10/667,321, filed Sep. 23, 2003, Omori et al.
U.S. Appl. No. 10/953,372, filed Sep. 30, 2004, Nihei et al.
U.S. Appl. No. 10/942,073, filed Sep. 16, 2004, Ozasa et al.
U.S. Appl. No. 10/854,268, filed May 27, 2004, Ishida et al.
U.S. Appl. No. 10/803,042, filed Mar. 18, 2004, Ishida et al.

* cited by examiner

1~10nS

1~10nS

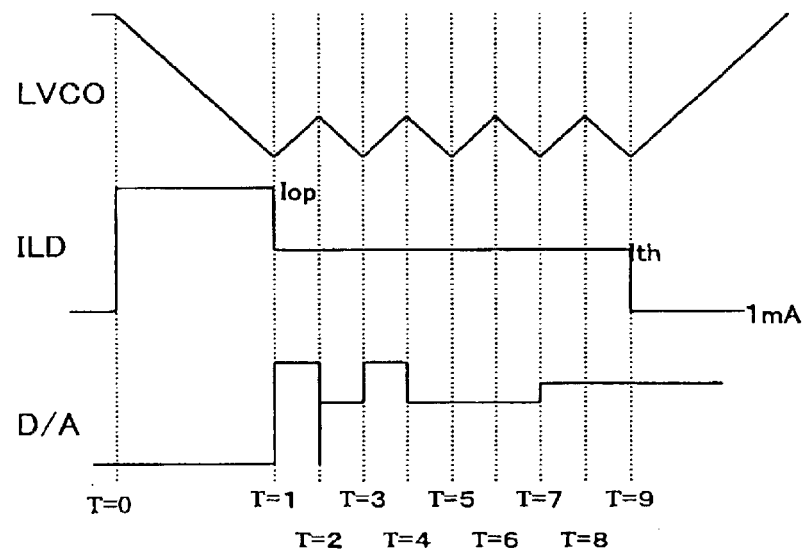
FIG.12A LVCO
FIG.12B ILD
FIG.12C D/A
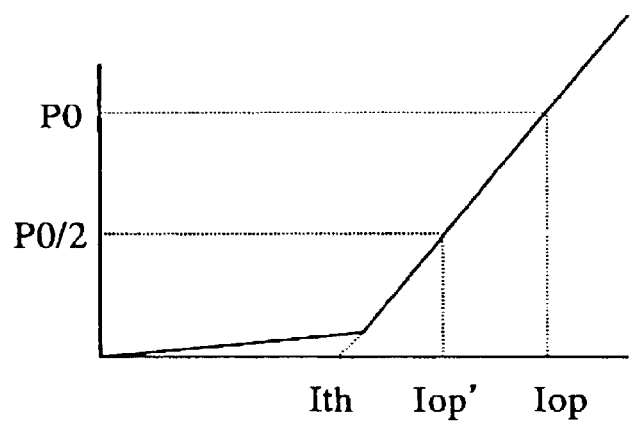
FIG.13

FIG.21H (A1)
(B1)
(C1)
(D1)
(E1)
(F1)
(F1)
(D1)
(G1)
(E1)
BIAS
0mA
(H1)

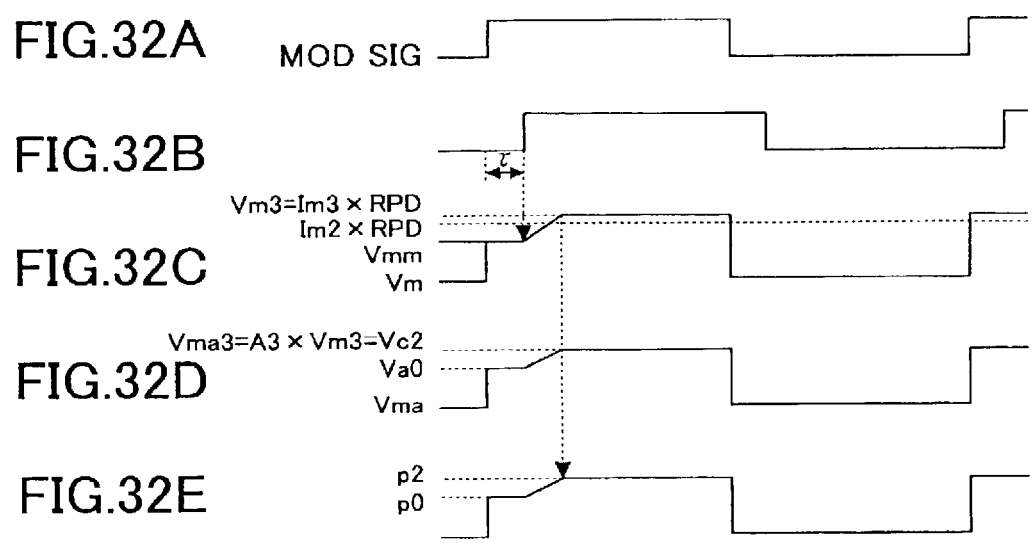

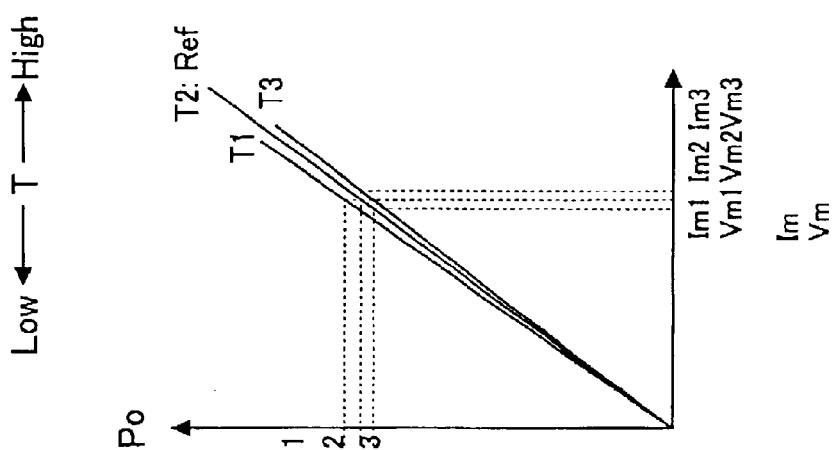
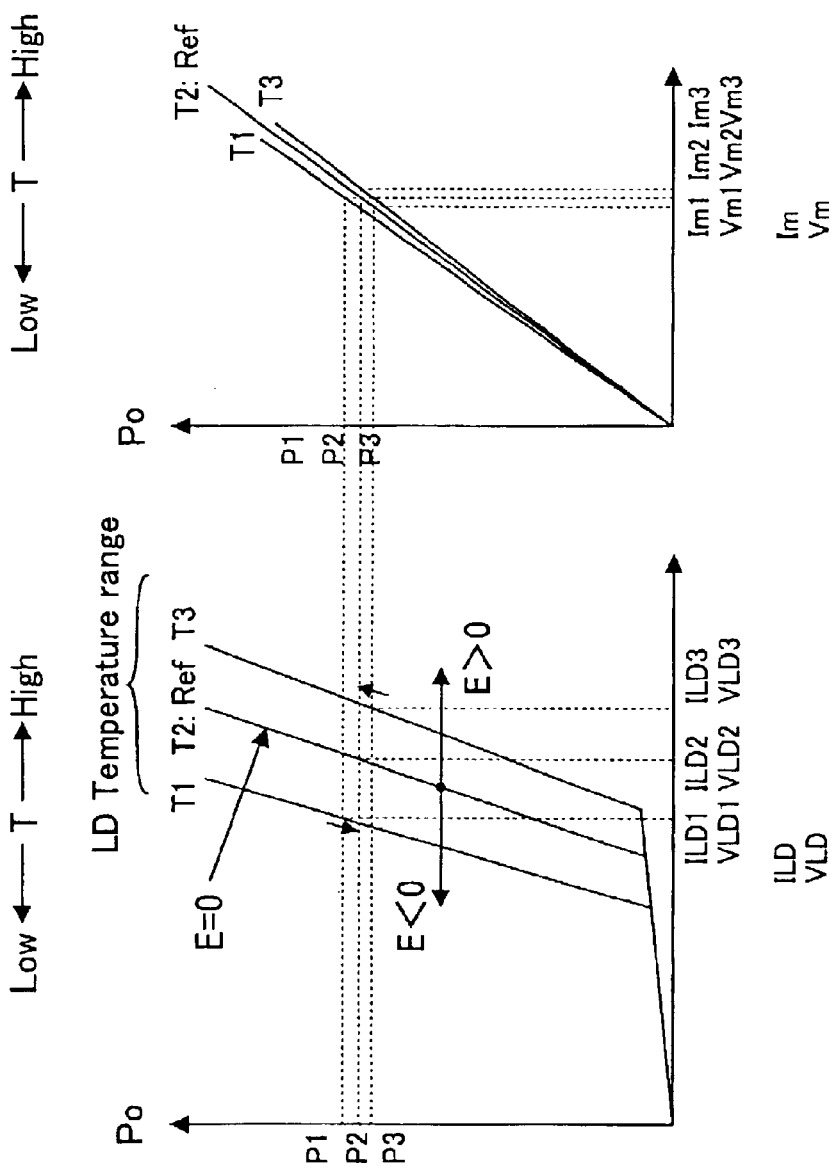
FIG.39A
FIG.39B

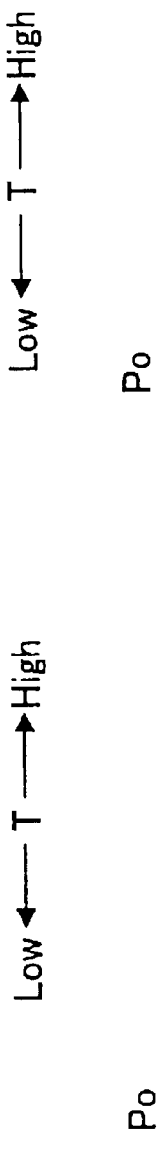
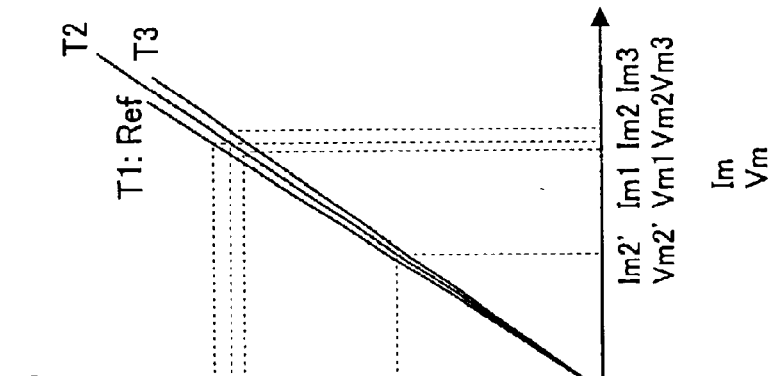
FIG.41A
FIG.41B

LASER DRIVER CIRCUIT

BACKGROUND OF THE INVENTION

The present invention generally relates to driving of laser diode and formation of images, and more particularly to a laser diode driver circuit for use in laser printers, optical disk drives, digital copiers, and optical telecommunication systems for driving a laser diode, as well as an image formation apparatus that uses such a laser diode driver circuit.

Conventionally, driving of a laser diode has been achieved either by a non-bias driving method or a biased driving method, wherein a non-bias driving method sets the bias current of the laser diode to zero and achieves the driving of the laser diode by a pulse current corresponding to an input signal. On the other hand, a biased driving method supplies a bias current to the laser diode with a level of the laser threshold current or less and drives the laser diode by superimposing a pulse current corresponding to an input signal to the bias current.

In the case of non-bias driving of laser diode, it takes some time after supplying of the driving current to the laser diode in response to the input signal, until there is formed carriers with a concentration level sufficient in the active layer of the laser diode for causing laser oscillation, and thus, there inevitably occurs a delay in the timing of optical emission. Thus, the use of such a non-bias driving of laser diode has been limited to the applications in which such a delay is negligible.

In the case of high-speed laser printers, optical disk drives, digital copiers, and the like, on the other hand, there is a stringent demand for high-speed driving of laser diode. When the non-bias driving is used in such applications, an optical pulse width smaller than the desired pulse width is obtained.

The biased driving method is proposed for overcoming the foregoing difficulty of non-bias driving method. In the biased driving method, it should be noted that a bias current is supplied with a level or magnitude corresponding to the threshold of laser oscillation, and the delay of optical emission is eliminated.

In the biased driving method, on the other hand, it should be noted that the laser diode emits optical radiation continuously at the level of the laser oscillation threshold (generally 200–3009 μW), even in the case the laser diode is not driven for laser oscillation. Thus, in the case the laser diode is used for optical telecommunication, there occurs a deterioration of optical extinction ratio. In the case the laser diode is used in laser printers, optical disk drives, digital copiers, and the like, on the other hand, there is caused the problem of the white background becoming dark because of the exposure to continuous optical emission of the laser diode.

In order to overcome the foregoing problems, there are proposals in the field of optical telecommunications to drive a laser diode basically with the non-bias driving method and to supply a threshold current immediately before the timing of the optical emission.

In the application of laser printers, optical disk drives or digital copiers, on the other hand, red laser diodes operating at the wavelength of 650 nm, or ultraviolet laser diodes operating at the wavelength of 400 nm, are currently used to improve the resolution of recording, while the laser diodes noted above generally require a longer time than the conventional laser diodes operating at the wavelength of 1.3 or 1.5 μm or the laser diode operating at the wavelength of 780 nm, in order that the carrier concentration level in the active layer reaches the level enabling laser oscillation. Thus, the foregoing conventional approach can only provide an optical signal with an optical width smaller than the desired optical width for the optical signal.

Further, in the case of recording low concentration images on a recording medium by an optical output continuing for a short duration such as several nanoseconds or less, there arises a problem in that the optical output power does not reach the predetermined level needed for the beam spot. In such a case, the density of the recorded image becomes excessively thin, and the desired thickness or concentration of the image is not attained.

In order to deal with this problem, there has been a proposal in the Japanese Laid-Open Patent Publication 5-328071 to superimpose a differential pulse to the drive signal of the laser diode at the time of onset of the optical power.

However, such an approach cannot control the peak height of the differential pulses and there is a substantial risk that the laser diode may be damaged because of the uncontrolled peak height of the differential pulses. Further, this conventional approach has another drawback, in view of the fact that the duration of superimposing of the differential pulse is determined by the waveform of the differential pulse itself, in that, while it may be effective to compensate for the recording density for the initial period in which the recording density is very small, there is no guarantee that the recording density of graded images increases linearly thereafter.

Meanwhile, it is known that the relationship between the drive current and the optical output of a laser diode changes significantly with the environmental temperature. Thus, an APC (automatic power control) circuit has been used conventionally in order to maintain the optical output of the laser diode at a predetermined level. Reference should be made to the Japanese Laid-Open Patent Publication 11-298079.

An APC circuit typically includes a photodetector cooperating with the laser diode and a negative feedback control circuit, wherein the photodetector detects a part of the optical output of the laser diode and produces an electrical output signal indicative thereof, while the negative feedback circuit controls the forward bias current of the laser diode so that the electrical output of the photodiode representing the output optical power of the laser diode takes a value corresponding to the prescribed optical output level.

Thus, during a power hold interval, in which the output optical power of the laser diode is held constant, the bias current of the laser diode is controlled by the negative feedback control circuit noted above, while outside the power hold interval, a modulation signal is superimposed to the bias current so that the laser diode is turned on and off in response to the modulation signal.

According to such a construction, a fast laser modulation becomes possible, even in the interval in which the laser diode does not produce an optical beam, while such a construction has a drawback in that the laser output easily undergoes fluctuation during the interval in which the feedback control is not applied. Such a fluctuation may be caused by external disturbance such as the droop characteristics. In relation to this problem, there is proposed an APC construction in the Japanese Laid-Open Patent Publication 2-205086 for improving the accuracy and response speed of the feedback control.

Further, there is proposed an APC circuit that compensates for the decay of the output waveform of the photodetector at the time of impulse optical emission of the laser diode according to the Japanese Laid-Open Patent Publication 5-121805.

FIG. 1 shows the construction of such a conventional laser control circuit that uses an opto-electronic negative feedback loop.

Referring to FIG. 1, the laser control circuit includes a laser diode LD and a photodiode PD monitoring a part of the optical output of the laser diode LD, wherein the laser control circuit further includes a first opto-electronic negative feedback loop 2 in which there is provided a first error amplifying unit 1 controlling the forward bias current of the laser diode, such that a monitoring voltage signal Vm corresponding to a current signal Im obtained from the photodetector PD in proportion with the optical output of the laser diode in the optical-emission state (oscillating state) of the laser diode becomes identical with an external optical-emission level control signal Vc setting up the optical-emission level of the laser diode LD.

Further, there is provided a driver transistor Q1 such that the laser diode LD is connected to a collector thereof and such that a forward bias current signal of the laser diode LD is supplied to a base thereof. Further, a resistance RLD is connected across the emitter and ground of the transistor Q1.

Further, there is provided a second opto-electronic negative feedback loop 4 including a second error amplifier unit 3, such that the second opto-electronic negative feedback loop 4 controls the forward bias current of the laser diode LD in such a manner that the emitter voltage level of the driver transistor Q1 becomes equal to the extinction level control voltage (bias level control signal) at the extinction state (non-oscillating state) of the laser diode LD.

Further, there is provided a current drive unit 5 such that the current drive unit 5 switches the forward bias current of the laser diode LD between the optical-emission state and the extinction state in response to a modulation signal that provides the timing of modulation driving of the laser diode LD, and the current drive unit 5 carries out an automatic power control operation according to the value held in any of a sample hold circuit 6 and a sample hold circuit 7 respectively holding the output of the error amplifier 1 indicative of the peak value of the optical output of the laser diode LD in the optical emission state and the bottom value of the optical output of the laser diode LD in the extinction state, wherein supplying of the output of the error amplifier 1 or error amplifier 3 to the sample hold circuit 6 or 7 is controlled in response to the modulation signal via a NOR gate 9 or an AND gate 10. More specifically, the modulation signal is supplied to the NOR gate 9 or the AND gate 10 via a delay circuit 8, and the sample hold circuit 6 or 7 samples and holds the output of the error amplifier 1 or the output of the error amplifier 3 in the event the same signal state has continued in the modulation signal over a duration τ specified by the delay circuit 8.

Further, the circuit of FIG. 1 includes capacitors C1 and C2 for holding the forward bias voltage respectively for the optical emission state and for the extinction state.

Thus, according to the construction of FIG. 1, the forward bias current of the laser diode LD is controlled, in the case the laser diode LD is used to form an image in an image forming apparatus, automatically in the event the optical emission state or extinction state has continued for some time, irrespective of whether it is an image forming area or it is a non-image forming area.

Here, it should be noted that the output current Im of the photodetector PD used for monitoring the optical state of the laser diode LD is converted to the voltage signal Vm by a resistance RPD connected in series to the photodiode PD, and the resultant voltage signal Vm is fed back to the laser drive control circuit 2. In order to control the optical output of the laser diode LD with high precision, it is preferable that the monitoring electric current Im takes an output value suitable for carrying out a comparative control with respect to the optical emission level control signal Vc at the time of the feedback control.

Meanwhile, there is an increasing need of short-wavelength laser diodes in the image formation apparatuses such as laser beam printers or digital copiers so as to reduce the beam spot size and to increase the recording density of the images.

In the case of short-wavelength laser diodes, there is a tendency that the monitoring current Im of the laser diode LD becomes smaller as compared with a laser diode operating in a longer wavelength band. For example, the monitoring current Im of the a red laser diode operating at the wavelength band of 650 nm becomes smaller as compared with an infrared laser diode operating at the wavelength band of 780 nm.

In relation to this, the resistance RPD connected in series to the photodiode PD for converting the monitoring current Im to the monitoring voltage signal Vm takes a smaller resistance value in the case of the laser diode of the 650 nm band as compared with the laser diode of the 780 nm band. Thereby, there occurs a decrease of the magnitude of the monitoring voltage signal Vm in the short-wavelength laser diode similarly to the case of the monitoring current Im. Thus, such a decrease of output of the photodiode PD at the short wavelengths causes the problem of accuracy at the time of feedback control of the output optical power of the laser diode.

In view of the foregoing problems, there is a proposal to use an amplifier for amplifying the monitoring signal as represented in FIG. 2.

Referring to FIG. 2, it can be seen that there is provided an amplifier 110 for amplifying the monitoring voltage signal Vm converted from the monitoring current Im between the photodiode PD and the error amplifier 1. In FIG. 2, it should be noted that those parts corresponding to the parts described previously are designated by the same reference numerals and the description thereof will be omitted.

According to the construction of FIG. 2, the monitoring voltage Vm is amplified to a voltage Vma, and it becomes possible to adjust the monitoring voltage signal Vma to a level suitable for comparative control with the optical-emission level control signal Vc.

On the other hand, the operational characteristic of a laser diode depends on the operational temperature thereof, and thus, the foregoing feedback control has to be accompanied with a temperature correction by providing a temperature sensor for detecting the temperature of the laser diode LD.

However, the use of such a temperature sensor in the laser driver circuit increases the cost of the apparatuses that uses such a laser driver circuit and laser diode.

The present invention has an object of providing a laser control apparatus for stabilizing the output of a laser diode without using a temperature sensor.

SUMMARY OF THE INVENTION

Accordingly, it is a general object of the present invention to provide a novel and useful laser diode driver circuit and an image formation apparatus using a laser diode wherein the foregoing problems are eliminated.

Another and more specific object of the present invention is to provide a laser driver circuit capable of driving a laser diode with high speed and high precision, as well as an image formation apparatus using such a laser driver circuit.

Another object of the present invention is to provide a laser driver circuit, comprising:

a biasing circuit for supplying a bias current to a laser diode continuously with a level not causing laser oscillation in said laser diode;

a threshold current circuit for supplying a threshold current to said laser diode with a level not causing substantial laser oscillation in said laser diode; and a drive circuit for supplying a drive current to said laser diode in response to an input signal such that there occurs a laser oscillation in said laser diode in response to said drive current, wherein said threshold current circuit produces said threshold current in response to said input signal with an interval exceeding an interval of said drive current such that said interval of said threshold current includes said interval of said drive current, said laser driver circuit driving said laser diode by a sum of said bias current, said threshold current and said drive current.

Another object of the present invention is to provide an image forming apparatus, comprising:

a laser diode; a laser driver circuit driving said laser diode in response to an image modulation signal, such that said laser diode produces a laser beam modulated in response to said image modulation signal; a rotary photosensitive body; and a scanning mechanism scanning said rotary photosensitive body with said laser beam, said rotary photosensitive body being recorded with an electrostatic latent image with said laser diode, said laser driver circuit comprising:

a biasing circuit for supplying a bias current to said laser diode continuously with a level not causing laser oscillation in said laser diode;

a threshold current circuit for supplying a threshold current to said laser diode with a level not causing substantial laser oscillation in said laser diode; and a drive circuit for supplying a drive current to said laser diode in response to said image modulation signal such that there occurs a laser oscillation in said laser diode in response to said drive current, wherein said threshold current circuit produces said threshold current in response to said image modulation signal with an interval exceeding an interval of said drive current and such that said interval of said drive current includes said interval of laser oscillation, said laser driver circuit driving said laser diode by a sum of said bias current, said threshold current and said drive current.

According to the present invention, it becomes possible to control the laser diode with high speed and high accuracy.

Another object of the present invention is to provide a laser control circuit, comprising:

a first opto-electronic negative feedback loop including a first error amplifier, said first error amplifier controlling a forward bias current supplied to a laser diode such that an optical emission monitoring signal obtained by a monitoring photodetector in proportion with an optical output of said laser diode becomes equal to an optical emission level control signal;

a second opto-electronic negative feedback loop including a second error amplifier, said second error amplifier controlling said forward bias current such that an emitter voltage level of a drive transistor, having a collector connected to said laser diode and a base supplied with a forward bias current signal of said laser diode, becomes equal to an optical extinction level control voltage when said laser diode is in an extinction state;

a signal amplifier amplifying said optical emission monitoring signal produced by said photodetection device;

a current driver unit switching said forward bias current between an optical emission state and an optical extinction state of said laser diode in response to a modulation signal; and a sample-hold circuit including a peak hold circuit holding an optical emission level signal produced by said first error amplifier and a bottom hold circuit holding an optical extinction level signal produced by said second error amplifier, said laser control circuit controlling driving of said laser diode by using one of said optical emission level signal held in said peak hold circuit and said optical extinction signal held in said bottom hold circuit when said modulation signal takes an identical state continuously for a predetermined interval, said signal amplifier having a variable amplification factor, said amplification factor of said signal amplifier being determined in response to a reference temperature signal VLD0 and an operational voltage of said laser diode VLD.

According to the present invention, it becomes possible to achieve a control of the laser diode with compensation of temperature of the laser diode, without using a temperature sensor.

Other objects and further features of the present invention will become apparent from the following detailed description when read in conjunction with the attached drawings.

BRIEF DESCRIPTION OF THE DRAWINGS

FIGS. 12A–12C are diagram showing the initialization operation conducted in the circuit of FIG. 10;

FIG. 13 is a diagram showing another initialization of the laser driver circuit;

FIGS. 20A–20H are diagrams showing the operation of the laser driver circuit of FIG. 19;

FIGS. 21A–21H are diagrams showing another example of operation of the laser driver circuit of FIG. 19;

FIGS. 26A–26H are diagrams showing the operation of the laser driver circuit of FIG. 25;

FIGS. 32A–32E are diagrams showing another example of operation of the laser driver circuit of FIG. 29;

FIGS. 39A and 39B are diagrams explaining the principle of the laser driver circuit of the third embodiment;

FIGS. 41A and 41B are diagrams explaining the principle of the laser driver circuit of the third embodiment;

DETAILED DESCRIPTION OF THE INVENTION

[First Embodiment]

In a first embodiment, the present invention utilizes the characteristics of laser diode and achieves the driving of the laser diode by a sum of the bias current, threshold current and the drive current. Here, the drive current is set very small contrary to the conventional bias driving of laser diode.

In the non-biased state, it should be noted that the impedance of a laser diode takes a considerably large value, and it takes some time for the laser diode to become ready for laser oscillation in the case the threshold current is supplied to an unbiased laser diode because of the large inductance component, and the like, of the laser diode.

When a very small bias current, a magnitude of 1 mA would be sufficient, is supplied to the laser diode, on the other hand, the impedance of the laser diode is reduced significantly, and the laser diode becomes quickly ready for oscillation upon supplying of the threshold current in superposition to the bias current.

Because the bias current is thus very small and having a level lower than the threshold level, there occurs no substantial optical emission in the laser diode and there arises no problem such as deterioration of extinction ratio in the case the laser diode is used for telecommunication purposes or such as the darkening of white background in the case the laser diode is used for image recording purposes.

Figure 3:
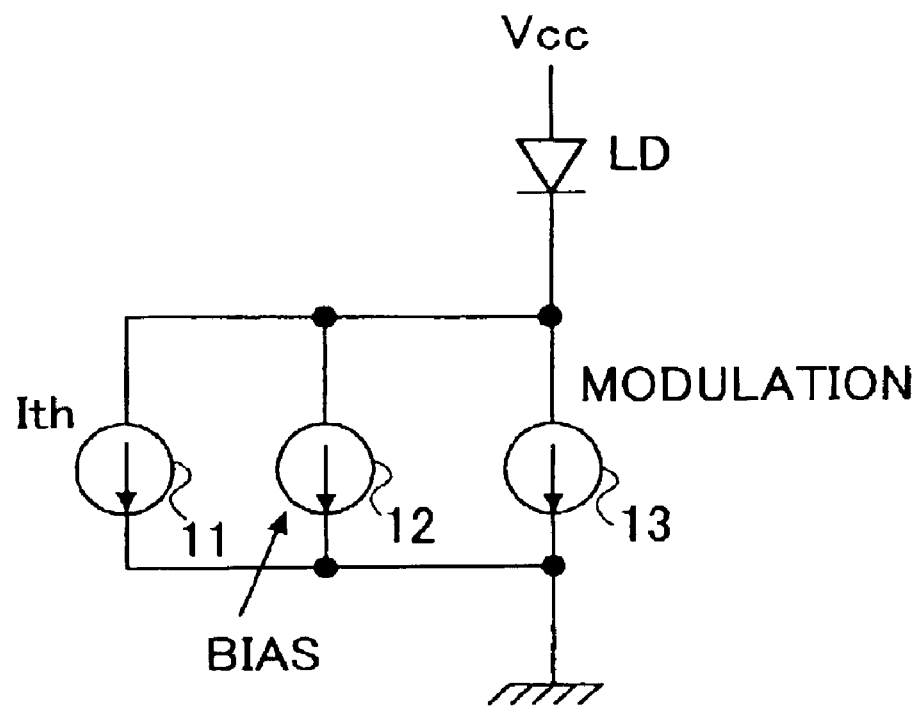
FIG. 3 is a diagram explaining the principle of a first embodiment of the present invention.

FIG. 3 shows the principle of the first mode of the present invention.

Referring to FIG. 3, the laser diode LD is driven by a bias current source 12, a threshold current source 11 and a modulation current source 13, wherein the current sources 11–13 are connected parallel with each other and connected in series to the laser diode. Thus, in the maximum output state of the laser diode, a current corresponding to the sum of the current sources 11–13 is supplied to the laser diode LD.

Here, it should be noted that the bias current source 12 supplies the bias current with a magnitude of generally about 1 mA and certainly not exceeding several milliamperes. The threshold current source 11, on the other hand, supplies the threshold current of the laser diode LD, wherein the threshold current source 11 may supply a current with such a magnitude that the magnitude of the bias current is subtracted from the magnitude of the threshold current of laser oscillation. Further, the current source 13 supplies the modulation current in response to a modulation signal supplied thereto, and the laser oscillation of the laser diode LD is controlled in response to the output current of the current source 13.

Figure 4:
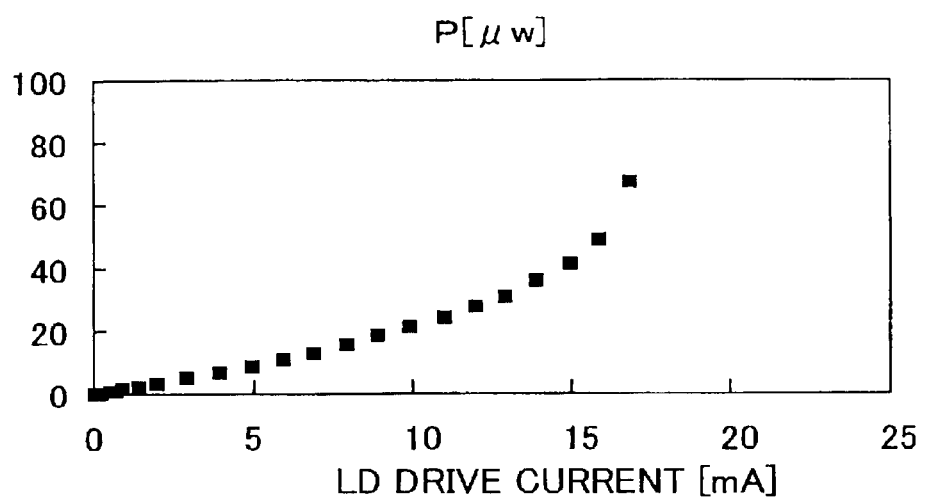
FIGS. 4 and 5 are diagrams explaining the principle of the first embodiment of the present invention.
Figure 5:
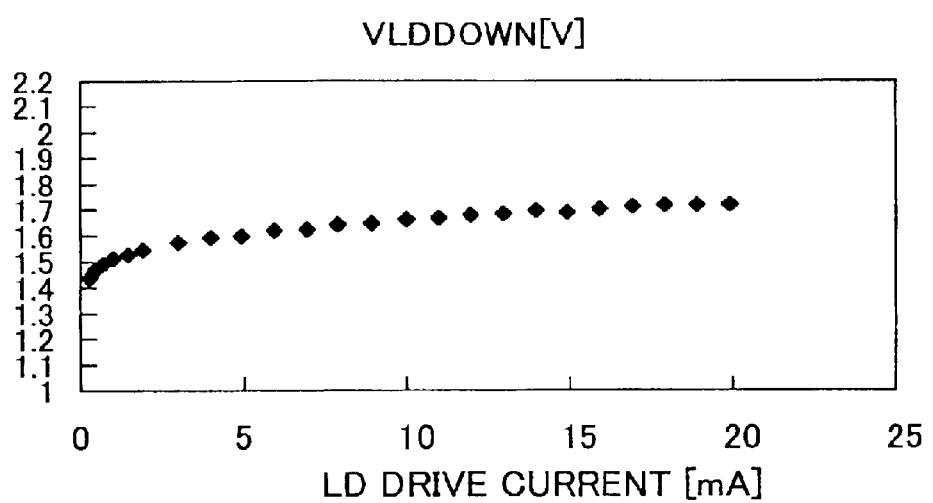

Here, description will be made on the bias current sources with reference to FIGS. 4 and 5, wherein FIG. 4 shows the relationship between the output power P($\mu$W) and the laser drive current of a laser diode, while FIG. 5 shows the relationship between a voltage drop VLDDOWN taking place across the laser diode and the laser drive current.

Referring to FIG. 5, it can be seen that there is caused a voltage drop $VLD_{DOWN}$ of about 1.4V when a drive current of only 250 $\mu$A is supplied to the laser diode. Further, it can be seen that the magnitude of the voltage drop $VLD_{DOWN}$ increases generally linearly when the magnitude of the drive current is increased further beyond the foregoing value of 250 $\mu$A.

In view of the fact that the voltage drop VLDDOWN is zero when the drive current is zero, the relationship of FIG. 4 indicates that there has been caused a sudden increase of voltage drop VLDDOWN as the drive current is increased from zero to 250 $\mu$A. In other words, the relationship of FIG. 4 means that there has been caused a sudden decrease of impedance of the laser diode, and that this sudden decrease of the impedance has been caused merely by causing to flow the drive current of only 250 $\mu$A.

The relationship of FIG. 5 therefore leads to a prediction that the response speed of the laser diode would be improved substantially when the threshold current is supplied to the laser diode in the state the foregoing drive current of 250 $\mu$A is supplied already to the laser diode.

For example, it is predicted that the change of further voltage drop would be suppressed and a high laser response speed would be achieved by supplying a minute bias current of about 1 mA to the laser diode. From FIG. 4, it can be seen that the laser output power corresponding to the drive current of 1 mA is 1.26 $\mu$W, which is only about 0.1% of the normal laser output power (about 1 mW or more). Thus, the use of such a minute bias current does not cause any problem of degradation of extinction ratio in the case the laser diode is used for optical telecommunications or darkening of the white background in the case the laser diode is used for image recording on a sheet.

In the case the laser diode is used in the form of a laser diode array, too, there occurs no problem when the non-activated laser diodes are producing an optical output with a power of about 0.1 $\mu$W.

It should be noted that the relationship of FIGS. 4 and 5 holds true not only in a specific laser diode but also in other general laser diodes.

<First Mode of the First Embodiment>

Figure 6:
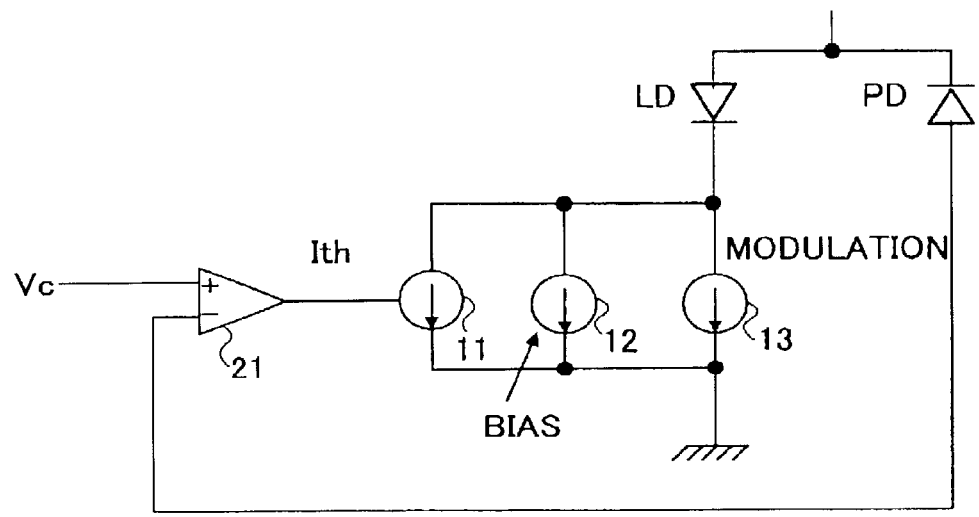
FIG. 6 is a diagram showing the construction of a laser driver circuit according to the first embodiment of the present invention.

FIG. 6 shows the construction of a laser driver circuit according to a first mode of the present embodiment, wherein those parts corresponding to the parts described previously are designated by the same reference numerals and the description thereof will be omitted.

Referring to FIG. 6, the driver circuit uses a photodiode PD for detecting the output of the laser diode LD, and the output of the photodetector PD is used in a comparator 21 for comparison with an optical emission control voltage Vc specifying a predetermined optical power of the laser diode LD. By controlling the threshold current source 11 in response to the output of the comparator 21, there is formed an opto-electronic negative feedback loop, and the output optical power of the laser diode LD is controlled in agreement with the optical emission control voltage Vc.

In the construction of FIG. 6, it should be noted that a fixed current source of small output power can be used for the bias current source 12. Further, the modulation current source 13 may also be a fixed current source.

<Second Mode of the First Embodiment>

Figure 7:
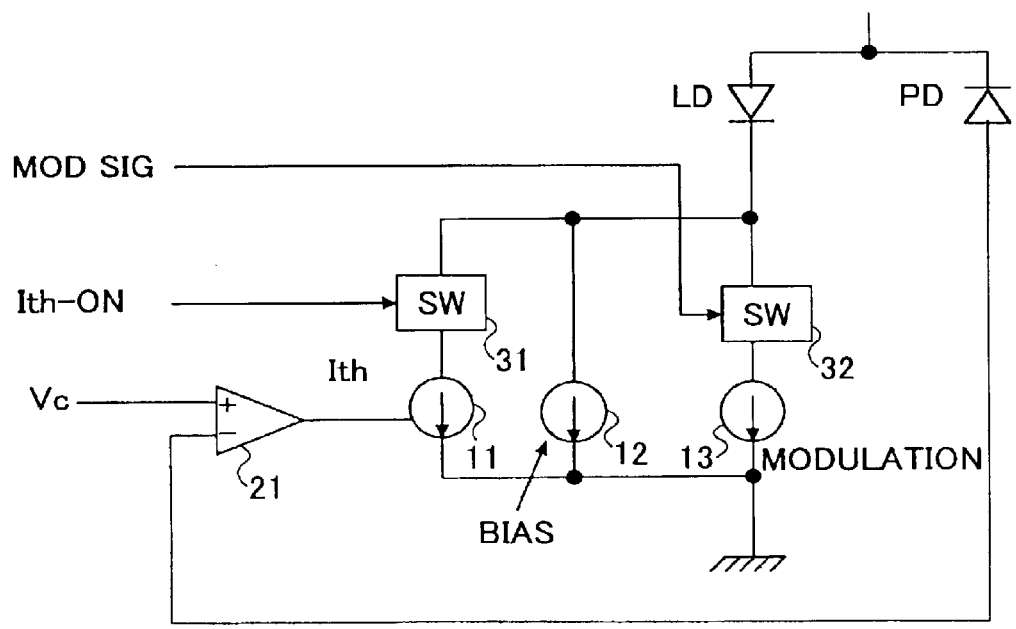
FIG. 7 is a diagram showing another construction mode of a laser driver circuit according to the first embodiment of the present invention.

FIG. 7 shows the construction of a laser driver circuit according to a second mode of the present embodiment, wherein those parts corresponding to the parts described previously are designated by the same reference numerals and the description thereof will be omitted.

Referring to FIG. 7, there is provided a switch circuit 31 between the laser diode LD and the threshold current source 11, and a similar switch circuit 32 is provided between the laser diode LD and the modulation current source 13.

Thus, when the switch circuit 31 is turned on in response to an external threshold-on signal (Ith-ON), the threshold current Ith of the threshold current source 11 is supplied to the laser diode LD. Similarly, when the switch circuit 32 is turned on in response to an external modulation signal (MOD SIG), the modulation current of the modulation current source 13 is supplied to the laser diode LD.

FIGS. 8A–8F show an example of the timing relationship between various signals used in the circuit of FIG. 7, while FIGS. 9A–9F show a different example.

Figure 8A:
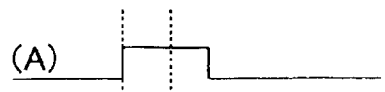
FIGS. 8A–8F are diagrams explaining the operation of the laser driver circuit of FIG. 7.
Figure 8B:
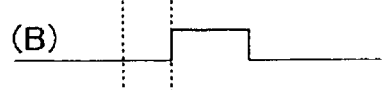

Referring to the drawings, FIG. 8A shows the waveform of an external command signal A commanding the driving of the laser diode LD, while FIG. 8B shows the waveform and timing of a delayed signal B identical with the command signal A but formed with a delay of 1–10 ns.

Figure 8C:
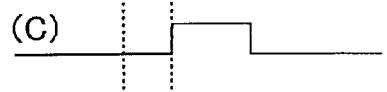
Figure 8D:

Further, FIG. 8C shows the waveform and timing of a modulation signal C formed identical with the delayed signal B of FIG. 8B, while FIG. 8D shows the waveform and timing of the threshold-on signal Ith formed as a logic sum of the command signal A and the delayed signal B so as to encompass the duration of the command signal A and the delayed signal B, wherein the threshold-on signal $I_{th}$ thus formed is supplied to the switch circuit 31 in the construction of FIG. 7.

Figure 8E:
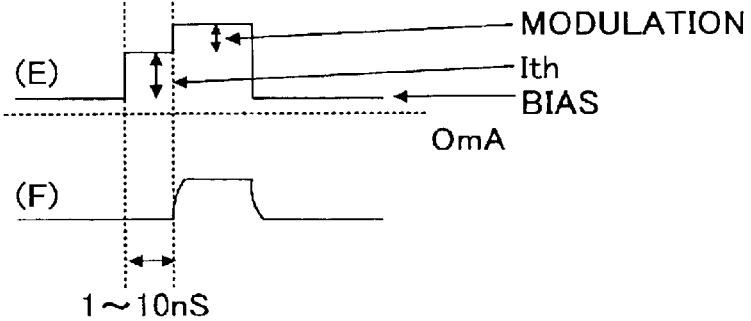

Further, FIG. 8E shows the waveform and timing of a drive current E supplied to the laser diode LD of FIG. 7, wherein the drive current is a sum of the bias current produced by the bias current source 12, the threshold current Ith produced by the threshold current source 11 and the modulation current produced by the modulation current source 13.

Figure 8F:
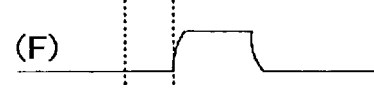

As a result of driving of the laser diode LD with the drive current E, there occurs a laser oscillation in the laser diode D with a waveform and timing as represented in FIG. 8F.

As can be seen in FIG. 8F, the actual drive current E supplied to the laser diode LD includes the bias component supplied continuously, and the threshold current is superimposed to the bias component 1–10 ns before the transition on of the modulation signal C to the turned-on state. Further, the laser diode LD is turned off in response to the trailing edge of the modulation current C of FIG. 8C.

It should be noted that the delay of 1–10 ns of the modulation signal C with respect to the command signal A is advantageous particularly in the case of using red laser diode or ultraviolet laser diode in which there is a need of taking time of 1–10 ns for accumulation of carriers in the active layer of the laser diode with a concentration level sufficient for causing laser oscillation. This delay time can be adjusted as desired externally in the case the laser driver circuit is realized in the form of an ASIC (application specific integrated circuit).

In the case the laser driver circuit is used for an image recording apparatus, the foregoing interval of 1–10 ns before the drive current E fully rising up may cause the problem of unwanted premature exposure of the photosensitive medium. However, such a premature recording does not cause any serious degradation of the recorded image quality, as long as the duration of the premature recording is within the interval of one recording dot.

As noted previously, FIGS. 9A–9F show a different example.

Figure 9A:
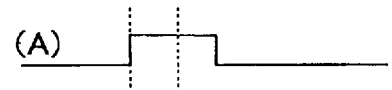
FIGS. 9A–9F are diagrams showing another example of operation of the laser diode of FIG. 7.
Figure 9B:
Figure 9C:
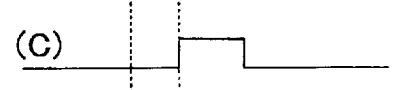
Figure 9D:
Figure 9E:
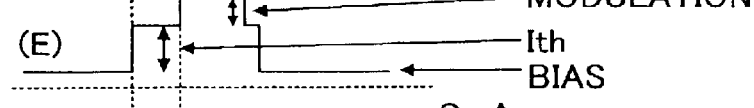
Figure 9F:
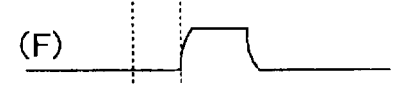

In the example of FIGS. 9A–9F, it will be noted that the modulation signal C of FIG. 9C first causes transition to turned off state and the threshold turn-on signal D of FIG. 9D undergoes a corresponding transition thereafter. It should be noted that such a scheme of signal transition is easier to implement as compared with the signal transition scheme of FIGS. 8A–8F. Further, the signal transition scheme of FIGS. 9A–9F can avoid the premature turning off of the threshold current and the optical pulse of FIG. 9F is formed with reliability and reproducibility.

Even when there is a delay of several nanoseconds between the trailing edge of the modulation signal C and the trailing edge of the threshold-on signal D, such a delay does not cause any serious degradation of image quality in the case the laser driver circuit is used in an image forming apparatus.

<Third Mode of the First Embodiment>

In the present mode of the invention, differential quantum efficiency of the laser diode is detected at the time of throwing electric power to the laser diode or at the time of canceling the reset state of the laser diode, so that the modulation current is initialized based on the detected differential quantum efficiency. It should be noted that differential quantum efficiency represents a slope of the output optical power with respect to the drive current injected to the laser diode.

Figure 10:
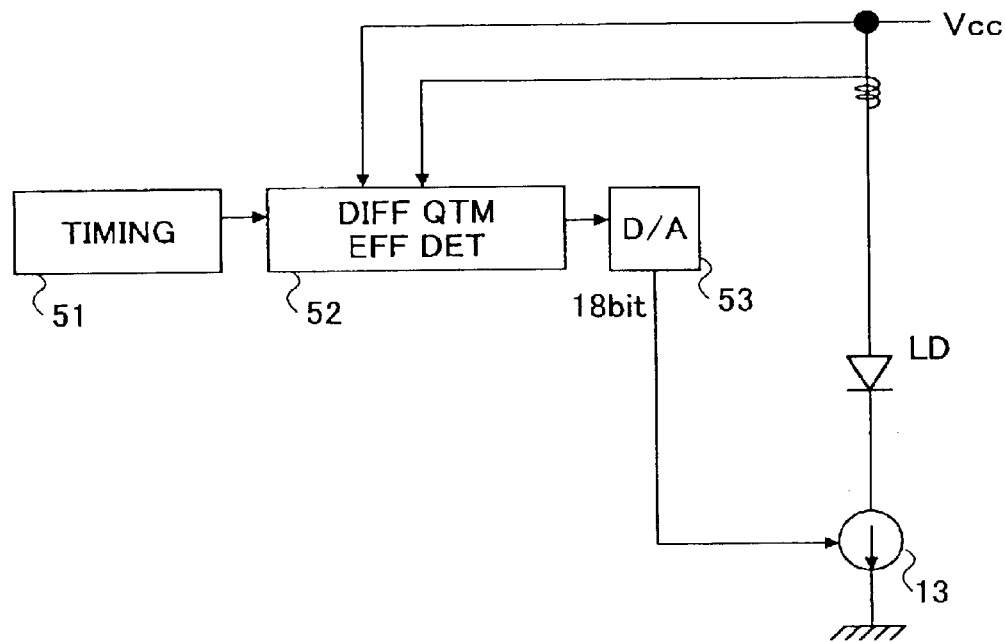
FIG. 10 is a diagram explaining the initialization of the laser driver circuit of FIG. 7.

FIG. 10 shows the construction of the present embodiment.

Referring to FIG. 10, it can be seen that the laser driver circuit of the present embodiment includes a timing circuit 51, a differential quantum efficiency detection circuit 52 and a D/A converter 53.

In the initialization process, the modulation current source 13 is set such that the modulation current source 13 produces an initial current of $I_{OP}-I_{TH}$, wherein $I_{OP}$ represents the current flowing through the laser diode LD in the state the laser diode LD is operated at the maximum output power, while $I_{TH}$ represents the threshold laser current.

By doing so, the laser diode LD is driven with the predetermined maximum power when the foregoing modulation current is supplied to the laser diode LD together with the threshold current $I_{th}$ from the threshold current source 11.

As the threshold current source 11 produces a drive current with a magnitude smaller than the maximum current $I_{OP}$ in the present invention, the load of the current source 11 is reduced. Further, the laser diode LD thus driven with the modulation current source 13 and the threshold current source 11 is free from the problem of excessive driving and the lifetime of the laser diode LD is increased.

Figure 11:
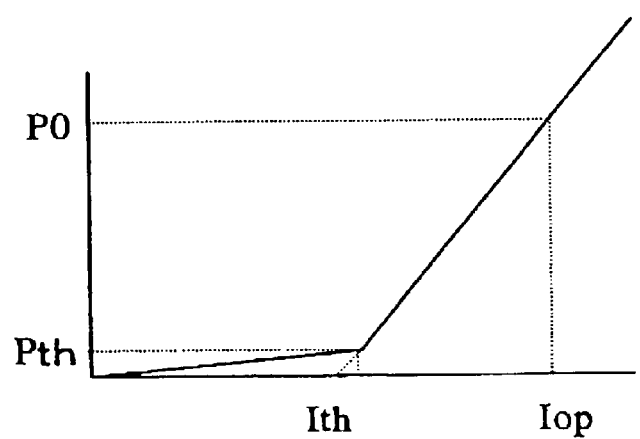
FIG. 11 is a diagram showing the principle of initialization achieved by the circuit of FIG. 10.

FIG. 11 and FIGS. 12A–12C show a first method of initialization of the modulation current source 13, wherein FIG. 11 shows the differential quantum efficiency of the laser diode.

Referring to FIG. 11, it can be seen that the laser diode starts to oscillate when the current supplied to the laser diode is increased and reached the threshold current $I_{TH}$. In such a threshold state, the laser diode produces a threshold optical output $P_{Th}$. Further, $I_{OP}$ in FIG. 11 represents the maximum current of the laser diode prescribed by the specification, and the laser diode produces the optical output power $P_o$ when driven with the drive current $I_{OP}$.

FIG. 12A shows the waveform of a timing signal LVCO produced by the timing circuit 51, while FIG. 12B shows the waveform of a current ILD supplied to the laser diode LD. Further, FIG. 12C shows the digital value produced by the D/A converter 53. It should be noted that the numeric values of FIG. 12C are shown merely as an example and the present invention is by no means limited to such specific numeric values.

Referring to FIG. 12A, the timing circuit 51 is activated only at the initial period of laser operation and supplies the timing signal LVCO to the differential quantum efficiency detector 52, while the differential quantum efficiency detector 52 produces ten timing signals T=0 through T=9 in response to the timing signal LVCO.

The differential quantum efficiency detector 52 thereby performs a processing in response to each timing signal and supplies eight-bit value to the D/A converter 53. The D/A converter 53 in turn outputs the values such as 1, 0.5, 0.25, 0.125, and the like, in the order of magnitude.

It should be noted that the differential quantum efficiency detector 52 drives the laser diode LD forcedly with the maximum power at T=0, and then drives the laser diode LD in the vicinity of the threshold current $I_{TH}$ at T=1. This is called offset driving of laser diode. Further, the differential quantum efficiency detector 52 turns off the laser diode LD at T=9 such that only the bias current of about 1 mA is supplied to the laser diode LD.

The differential quantum efficiency detector 52 thereby holds the difference $I_{OP}-I_{TH}$ at T=1. Further, the differential quantum efficiency detector 52 supplies the values of 1, 0.5, 0.25, 0.125, and the like, to the D/A converter 53 in response to the timing given by the timing circuit 51. The modulation current source 13 is thereby controlled with the output value of the D/A converter 53.

Hereinafter, explanation will be made for the case the values 1.0, 0.5, 0.25 and 0.125 of the D/A converter 53 correspond respectively to the modulation current of 1 mA, 0.5 mA, 0.25 mA and 0.125 mA.

At the timing of T=2, the output value of 1 is supplied to the modulation current source 13 from the D/A converter 53, and the modulation current source 13 produces a current of 1 mA. Thereby, the differential quantum efficiency detector 52 compares this current with the value of 0.7 mA held therein. As there holds the relationship 1 mA>0.7 mA, the differential quantum efficiency detector 52 ignores the value 1 and prepares for the next timing signal.

At the timing of T=3, the value of 0.5 is supplied to the modulation current source 13 and the modulation current source 13 produces a current of 0.5 mA. Thereby, the differential quantum efficiency detector 52 detects and compares this current with the current of 0.7 mA held therein. As there holds the relationship 0.5 mA<0.7 mA, the differential quantum efficiency detector sets the value 0.5 therein and prepares for the next timing signal.

Next, at the timing T=4, the output value of 0.25 is supplied to the modulation current source 13 from the D/A converter 53, and the modulation current source 13 produces a current of 0.25 mA. Thereby, the differential quantum efficiency detector 52 detects this current value of 0.25 mA and compares the sum of this current of 0.25 mA and the previously set current value of 0.5 mA, in other words, the current of 0.75 mA, with the value of 0.7 mA held therein. As there holds the relationship 0.75 mA>0.7 mA, the differential quantum efficiency detector 52 ignores the value 0.5 and prepares for the next timing signal.

Next, at the timing T=5, the output value of 0.125 is supplied to the modulation current source 13 from the D/A converter 53, and the modulation current source 13 produces a current of 0.125 mA. Thereby, the differential quantum efficiency detector 52 detects this current value of 0.125 mA and compares the sum of this current of 0.125 mA and the previously set current value of 0.5 mA, in other words, the current of 0.625 mA, with the value of 0.7 mA held therein. As there holds the relationship 0.625 mA<0.7 mA, the differential quantum efficiency detector 52 sets the value 0.125 therein and prepares for the next timing signal.

Next, at the timing T=6, the output value of 0.0625 is supplied to the modulation current source 13 from the D/A converter 53, and the modulation current source 13 produces a current of 0.0625 mA. Thereby, the differential quantum efficiency detector 52 detects this current value of 0.0625 mA and compares the sum of this current of 0.0625 mA and the previously set current values of 0.5 mA and 0.125 mA, in other words, the current of 0.6875 mA, with the value of 0.7 mA held therein. As there holds the relationship 0.6875 mA<0.7 mA, the differential quantum efficiency detector 52 sets the value 0.0625 therein and prepares for the next timing signal.

Next, at the timing T=7, the output value of 0.03125 is supplied to the modulation current source 13 from the D/A converter 53, and the modulation current source 13 produces a current of 0.03125 mA. Thereby, the differential quantum efficiency detector 52 detects this current value of 0.03125 mA and compares the sum of this current of 0.03125 mA and the previously set current values of 0.5 mA, 0.125 mA and 0.0625 mA, in other words, the current of 0.71875 mA, with the value of 0.7 mA held therein. As there holds the relationship 0.71875 mA>0.7 mA, the differential quantum efficiency detector 52 ignores the value 0.03125 therein and the values continuing therefrom.

According to such a procedure, the initial current of the modulation current source 13 is set to the value of $(I_{OP}-I_{TH})$. In the above example, the values of 0.5, 0.125 and 0.0625 are used for the output values of the D/A converter 53, and the current of 0.6875 mA corresponding to the foregoing values is supplied from the modulation current source 13.

It should be noted that the foregoing numeric values are merely represent an example. Thus, the numeric values may be changed or rounded as necessary. Further, the D/A converter is not limited to the 8-bit construction. When a D/A converter having different bit number construction is used, the number of the timings may be changed accordingly.

In the present embodiment, it is also possible to provide a separate current source driven only at the initialization mode for obtaining the threshold current $I_{TH}$ at the time of the initialization mode, such that the separate current source can be set from an external terminal so that a desired offset optical emission value is obtained. Further, the timing of the timing signal LVCO may be changed from such an external terminal.

FIG. 13 shows a second method of initialization of the modulation current source 13.

Referring to FIG. 13, the value of $(I_{OP}/2-_{TH})$ is used in the present embodiment as the value held in the differential quantum efficiency detector 52 rather than the value of $(I_{OP}-I_{TH})$. Thus, the differential quantum efficiency detector 52 multiplies the factor of 2 to the value of $(I_{OP}/2-I_{TH})$ held therein and compares the value thus obtained with the current values corresponding to the output values of the D/A converter 53 during the timings of T=2 to T=9.

Otherwise, the second method is identical with the method explained with reference to FIG. 11 and FIGS. 12A–12C, and further description will be omitted.

It should be noted that it is possible to achieve the desired initialization of the modulation current source based on the drive voltage of the laser diode such as $VLD_{FULL}-VLD_{TH}$ corresponding to the current $I_{OP}-I_{TH}$ or the drive voltage $VLD_{FULL}/2-VLD_{TH}$ corresponding to the current $I_{OP}/2-I_{TH}$. Here, it should be noted that $VLD_{FULL}$ represents the drive voltage of the laser diode in the state the laser diode produces the maximum output power with the drive current $I_{OP}$, while VLDTH represents the drive voltage of the laser diode in the state the laser diode is driven with the threshold current $I_{TH}$.

According to the first method, the D/A converter 53 drives the laser diode with the values of 1, 0.5, 0.25, 0.125, . . . and thus, there can be a case that the initial drive current exceeds the normal drive current of the laser diode. In the second method, this problem of excessive drive current is positively avoided by using $I_{OP}/2-I_{TH}$ rather than using $I_{OP}-I_{TH}$ for the initialization of the modulation current source 13.

<Fourth Mode of the First Embodiment>

Figure 14:
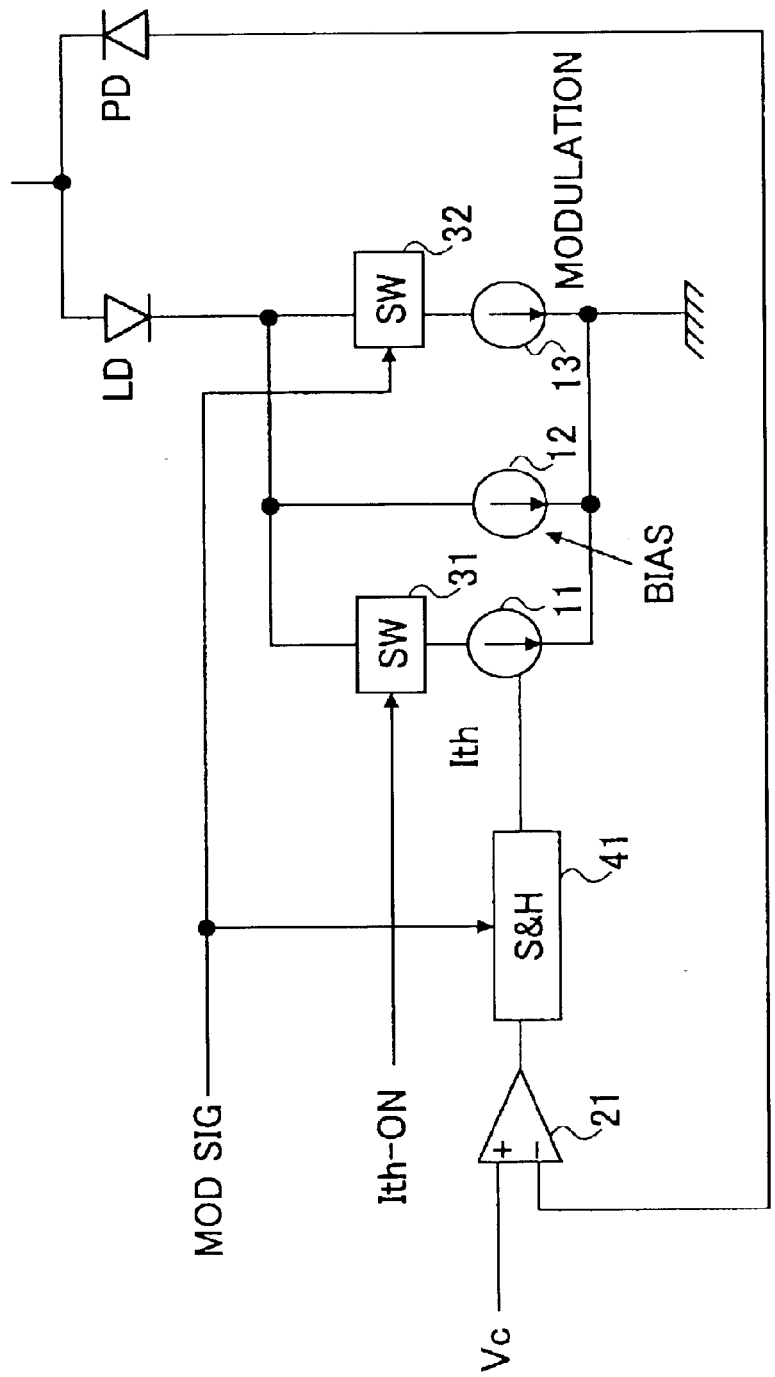
FIG. 14 is a diagram showing another construction mode of the laser driver circuit of the first embodiment of the present invention.

FIG. 14 shows the construction of the laser driver circuit according to a fourth mode of the present embodiment, wherein those parts corresponding to the parts described previously are designated by the same reference numerals and the description thereof will be omitted.

Referring to FIG. 14, it can be seen that there is provided a sample hold circuit 41 between the comparator 21 and the threshold current source 11, and the sample hold circuit 41 is controlled by the modulation signal such that the sampling of the output of the comparator 21 is conducted with the timing in which the modulation signal is on. During the interval in which the modulation signal is off, the sample and hold circuit 41 holds the output of the comparator 21.

According to the construction of FIG. 14, it becomes possible to control the driving power of the laser diode LD not only in the area outside the image recording area but also in the image recording area, by conducting sampling each time the laser diode is turned on.

<Fifth Mode of the First Embodiment>

Figure 15:
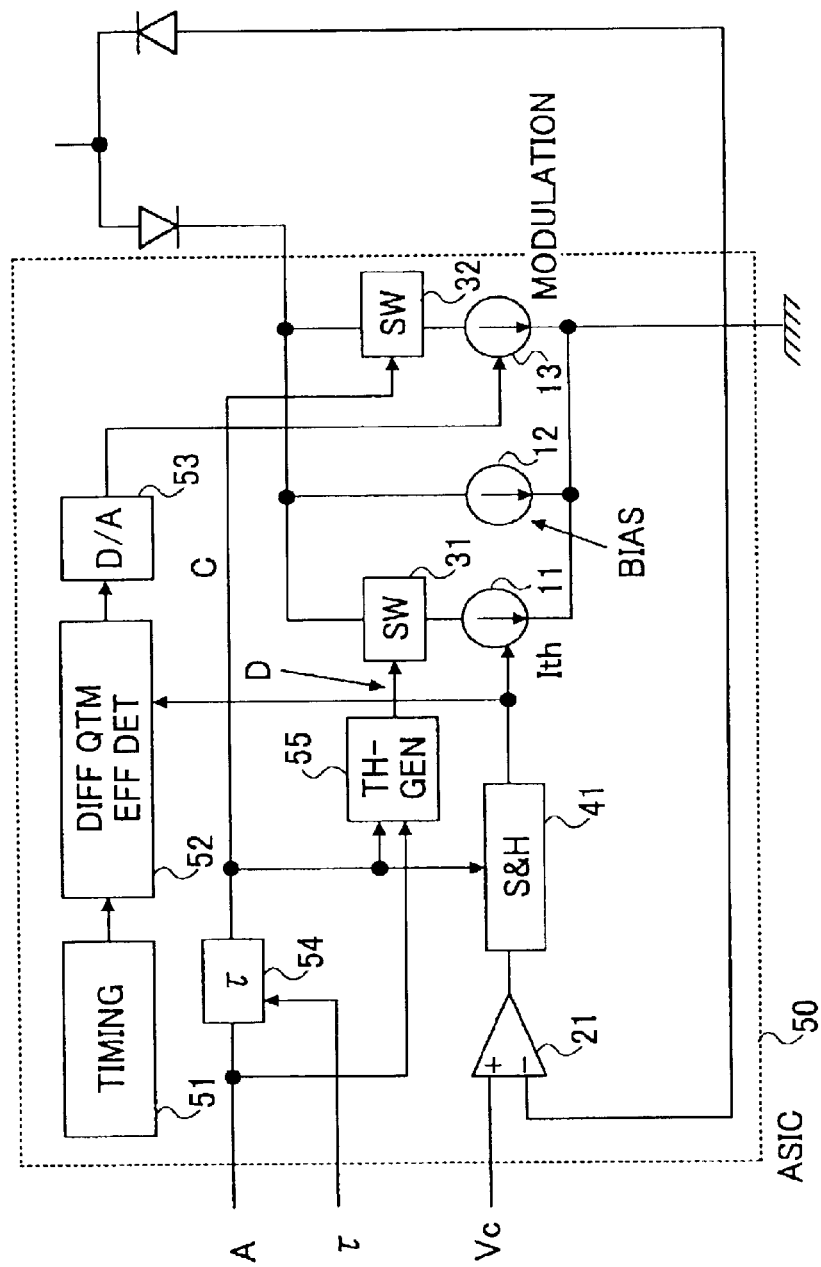
FIG. 15 is a diagram showing a further construction mode of the laser driver circuit according to the first embodiment of the present invention.

FIG. 15 shows the construction of the laser driver circuit according to a fifth mode of the first embodiment of the present invention, wherein those parts corresponding to the parts described previously are designated by the same reference numerals and the description thereof will be omitted. It should be noted that the present mode invention represents the case in which the laser driver circuit operating with the timing charts of FIGS. 8A–8F or FIGS. 9A–9F is realized in the form of a single chip ASIC 50. Referring to FIG. 15, the external command signal A of FIG. 8A is converted to the delayed signal B of FIG. 8B by providing a delay τ at a delay unit 54, and the delayed signal B thus formed is used as the modulation signal C of FIG. 8C. The delay τ of the delay unit 54 is controlled by an external delay signal τ.

The command signal A and the delayed signal B are supplied to a threshold signal generator 55, and the threshold signal generator 55 produces the threshold-on signal D of FIG. 8D.

The modulation signal C is used to drive the switch circuit 32 of the modulation current source 13, while the threshold-on signal is used to drive the switch circuit 31 of the threshold current source 11. As a result, there is formed a drive current of the laser diode with a waveform represented in FIG. 8E.

Similarly to FIG. 14, the threshold current is sampled in response to the on-duration of the modulation signal and is held in response to the off-duration of the modulation signal. Thereby, the D/A converter, which determines the modulation current, controls the modulation current source 13 in response to the timing represented in FIGS. 12A–12C and the laser diode LD is controlled such that there is formed a predetermined optical output.

<Sixth Mode of the First Embodiment>

Figure 16:
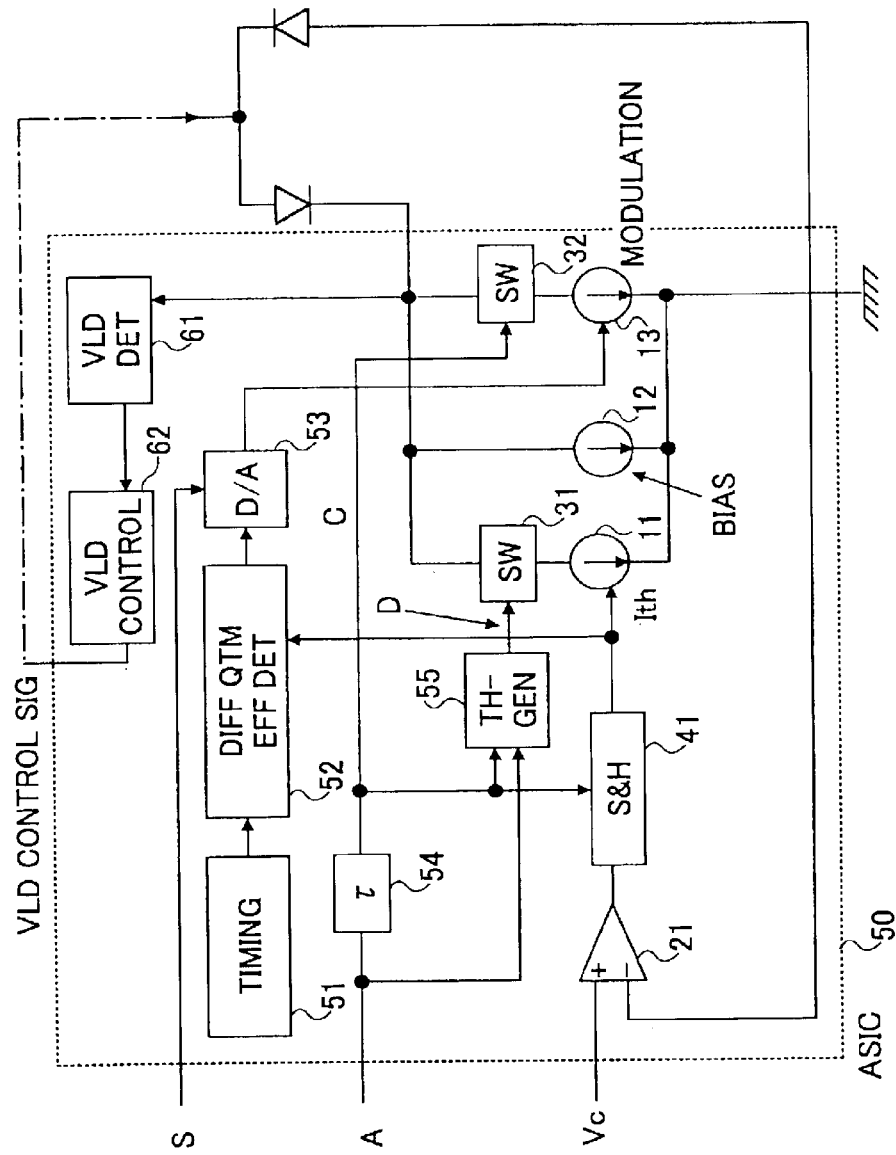
FIG. 16 is a diagram showing a further construction mode of the laser driver circuit according to the first embodiment of the present invention.

FIG. 16 shows the construction of a laser driver circuit according to a sixth mode of the first embodiment, wherein those parts corresponding to the parts described previously are designated by the same reference numerals and the description thereof will be omitted.

First, the function of shading correction will be explained.

As noted previously, the differential quantum efficiency of the laser diode detected at the time of throwing of electric power or at the time of restarting of the laser operation after resetting is set in the D/A converter 53. Thereby, it is possible to change the optical output of the laser diode LD by changing the full scale of optical output by way of supplying a current signal or voltage signal determining the full scale.

In the case of an optical writing system using a laser diode for raster-scanning, there is a tendency that the energy density at the central part of the recording medium is increased as compared with the marginal part, and thus, it is practiced to apply a shading correction for canceling the foregoing tendency, such that the optical output power of the laser diode during the on-interval is increased at the edge part of the recording medium and decreased at the central part of the recording medium.

It is sufficient that this shading correction is achieved with a rate such that the correction is made within the interval of scanning of one line by the laser diode. Thus, the shading correction is achieved by changing the output optical power of the laser diode during the scanning of one line by way of changing the current value of the D/A converter 53 by an external shading correction control signal S.

Next, the function of Laser diode power supply control (VLD) will be explained.

In the case the laser driver circuit is integrated in the form of an ASIC, there arises a problem of large power consumption of the ASIC because of the need of supplying a large electric current of 100 mA, for example, to the laser diode. Assuming that there is a voltage drop of about 2V across the laser diode when the laser diode is driven by a voltage source of 5V, there is a need for the ASIC to feed the laser diode with an electrical power of 300 mW (=3V×100 mA). In the case the laser driver circuit is used to drive two laser diodes, therefore, it is necessary that the ASIC can supply the electrical power of 600 mW to the laser diodes. In the case the laser driver circuit is used to drive three laser diodes, on the other hand, it is necessary that the ASIC can supply the electrical power of 1200 mW.

Thus, it is extremely difficult to drive multiple laser diodes with the construction of the laser driver circuit described heretofore.

One reason of the foregoing difficulty exists in the point that the voltage level at the cathode of the laser diode is set to 3V in the previous as well as in the conventional laser driver circuits. When the cathode voltage level of the laser diode can be to 1V, for example, it is possible to reduce the power consumption of the ASIC to about ⅓.

Thus, the present mode uses a VLD detector 61 for detecting the cathode voltage level of the laser diode and controls the same to a desired level such as 1V by a VLD controller 62 in response to the output of the VLD detector 61. Thereby, the VLD detector 61 detects the cathode voltage level of the laser diode LD during the on-interval of the threshold-on signal D or the modulation signal C, and the VLD controller 62 produces a VLD control signal in response to the output of the VLD detector 61 and supplied the VLD control signal to an external driver unit such as a base of a power transistor (not shown) having an emitter connected to the laser diode LD.

This VLD control can be achieved with a rate much slower than the modulation speed of the laser diode LD, and thus, any commonly used power transistor can be used for driving the laser diode LD.

By providing such a VLD control, it becomes possible to realize a laser driver circuit driving a large number of laser diodes.

[Second Embodiment]

Figure 17:
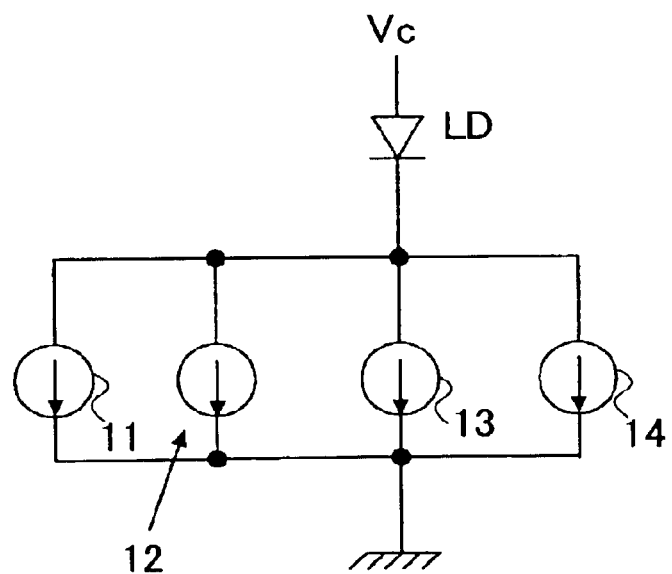
FIG. 17 is a diagram showing the principle of a second embodiment of the present invention.

FIG. 17 shows the principle of a laser driver circuit according to a second embodiment of the present invention, wherein those parts corresponding to the parts described previously are designated by the same reference numerals and the description thereof will be omitted.

Referring to FIG. 17, the laser driver circuit the laser driver circuit has a construction similar to the one described with reference to FIG. 3 except that there is provided an auxiliary modulation current source 14 parallel with other current sources 11–13, and thus, the laser diode LD is driven with a sum of the drive currents produced by the current sources 11–14. Thereby, it should be noted that the auxiliary modulation current source 14 is tuned on for only a very short interval such as 0.5–5 nm at the beginning of operation of the modulation current source 13. Similarly as before, the bias current source 12 supplies a drive current of about 1 mA, not exceeding several milliamperes throughout, while the threshold current source 11 supplies a threshold current of the laser diode. The current of the threshold current source 11 may be slightly smaller than the threshold current of laser oscillation in view of the fact that the threshold current 11 is superimposed to the bias current from the bias current source 12, similarly to the previous embodiment.

Thus, similarly to the previous embodiment, the laser drive circuit of the present embodiment improves the response of laser driving by causing to flow a minute bias current continuously to the laser diode such that the impedance of the laser diode is reduced. Here, the explanation made previously with reference to FIGS. 4 and 5 applies.

Further, according to the present embodiment, it becomes possible to change the carrier density in the active layer linearly with the modulation current, starting from a very low carrier concentration level, whatever the characteristics of the laser diode may be, by superimposing a current pulse to the modulation current at the beginning of the modulation current, with a magnitude proportional with the modulation current for a very short interval.

<First Mode of the Second Embodiment>

Figure 18:
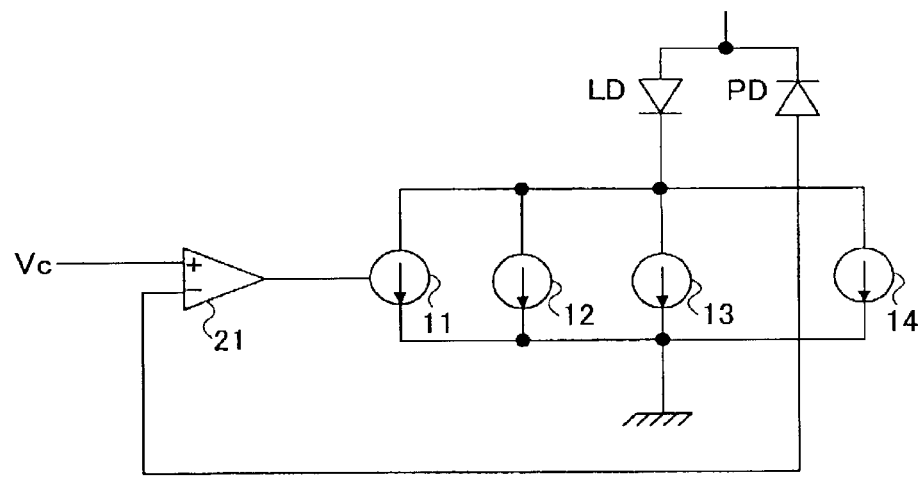
FIG. 18 is a diagram showing the construction of a laser driver circuit according to the second embodiment of the present invention.

FIG. 18 shows the construction of a laser driver circuit according to a first mode of the present embodiment, wherein those parts corresponding the parts described previously are designated by the same reference numerals.

Referring to FIG. 18, the laser driver circuit has a construction similar to that of FIG. 6, except for the auxiliary modulation current source 14. In the construction of FIG. 18, the threshold current source 11 is controlled by the comparator 21 such that the output of the photodetectgor PD coincides with the external control voltage Vc. Thereby, the temperature dependence of the threshold current source 11 is compensated for. With regard to the bias current source 12, the magnitude of the bias current is small as noted before, and the temperature change of the bias current source 12 does not cause a problem. Thus, it is possible to use a fixed current source for the bias current source 12.

According to the construction of FIG. 18, the laser driver circuit of the present mode can change the carrier concentration level in the active layer of the laser diode linearly by superimposing the current pulse F1 to the modulation current D1 in correspondence to the leading edge part thereof. Thereby, it becomes possible to realize a high-speed and high-precision laser driver circuit.

<Second Mode of the Second Embodiment>

Figure 19:
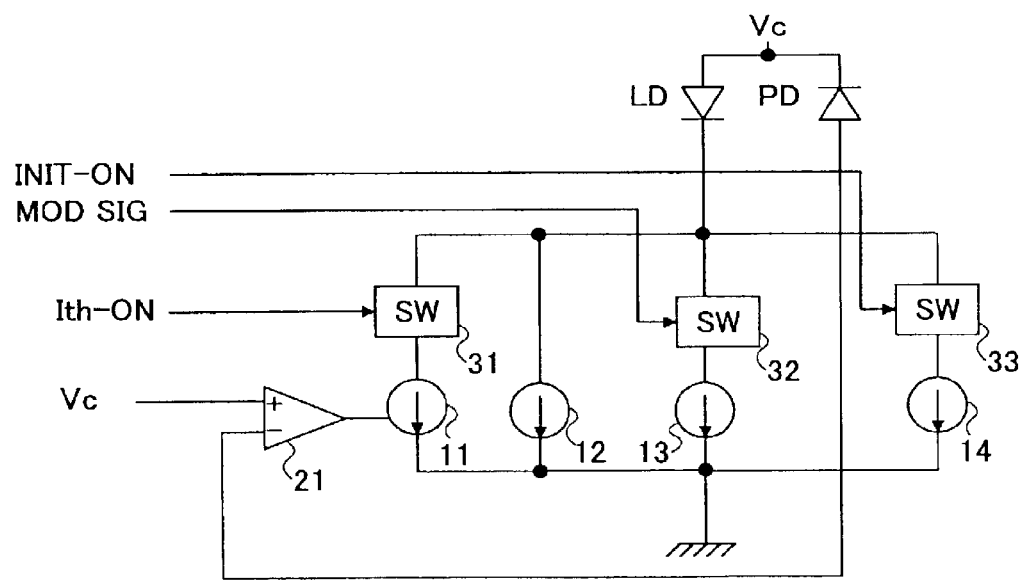
FIG. 19 is a diagram showing another construction mode of the laser driver circuit according to the second embodiment of the present invention.

FIG. 19 shows the construction of a laser driver circuit according to a second mode of the present embodiment, wherein those parts corresponding to the parts described previously are designated by the same reference numerals and the description thereof will be omitted.

Referring to FIG. 19, the laser driver circuit of FIG. 18 is modified similarly to the construction of FIG. 7, except that there is provided another switch circuit 33 in series to the auxiliary modulation current source 14, wherein the switch circuit 33 is driven in response to a modulation control signal INIT-ON.

Figure 20A:
Figure 20B:
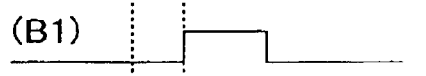

FIGS. 20A–20H show the operation of the laser driver circuit of FIG. 19, wherein FIG. 20A shows the waveform of an external command signal A1 corresponding to the signal A of FIG. 8A and commanding the driving of the laser diode LD, while FIG. 20B shows the waveform and timing of a first delayed signal B1 corresponding the signal B of FIG. 8B, wherein the delayed signal B1 is identical with the command signal A1 but formed with a first delay time. While not illustrated in FIG. 19, the laser driver circuit includes a delay circuit supplied with the external command signal A1 and producing the delayed signal B1 therefrom.

Further, FIG. 20B shows the waveform and timing of a second delayed signal C1, wherein the delayed signal C1 is identical with the command signal A1 but formed with a second delay time larger than the first delay time. While not illustrated in FIG. 19, the laser driver circuit includes a second delay circuit supplied with the external command signal A1 and producing the second delayed signal C1 therefrom. It should be noted that such a delay can be caused easily by using conventional inverters or buffer circuits. By changing the number of stages, it is possible to set the delay time as desired. Alternately, it is possible to cause such a delay by merely using a resistor and a capacitor.

Figure 20C:
Figure 20D:
Figure 20E:
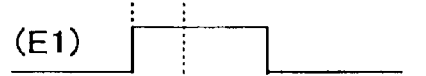

Further, FIG. 20D shows the waveform and timing of a modulation signal D1 formed identical with the first delayed signal B1 of FIG. 20B, while FIG. 20E shows the waveform and timing of the threshold-on signal $I_{th}$ formed by a logic sum of the command signal A1 and the first delayed signal B1 so as to encompass the duration of the command signal A1 and the first delayed signal B1, wherein the threshold-on signal $I_{th}$ thus formed is supplied to the switch circuit 31.

Figure 20F:
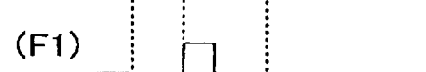

Further, FIG. 20F shows the waveform of a signal F1 used for the modulation control signal INIT-ON in the laser driver circuit of FIG. 19 for controlling the switch circuit 33, wherein it will be noted that the signal E1 is formed as a logic product of the first delayed signal B1 and a logic inversion of the second delayed signal C1.

Figure 20G:
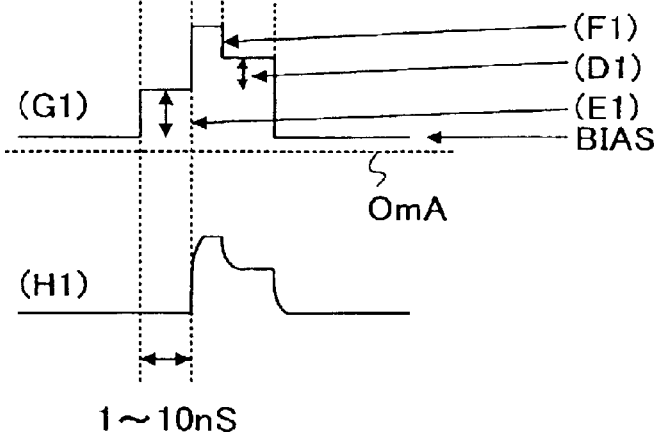

Further, FIG. 20G shows the waveform and timing of a drive current G1 supplied to the laser diode LD of FIG. 19, wherein the drive current G1 is a sum of the bias current produced by the bias current source 12, the threshold current $I_{th}$ produced by the threshold current source 11, the modulation current produced by the modulation current source 13, and the initial modulation current produced by the auxiliary modulation current source 14.

As a result of driving of the laser diode LD with the drive current G1, there occurs a laser oscillation in the laser diode D with a waveform and timing as represented in FIG. 20H.

Similarly to the previous embodiment explained with reference to FIGS. 8A–8F, the delay time of 1–10 ns with respect to the command signal A is advantageous for the modulation signal C particularly in the case of using red laser diode or ultraviolet laser diode in which there is a need of taking time of 1–10 ns for accumulation of carriers in the active layer of the laser diode with a concentration level sufficient for causing laser oscillation. This delay time can be adjusted as desired externally in the case the laser driver circuit is realized in the form of an ASIC (application specific integrated circuit).

Naturally, it is preferable to set this delay time as small as possible. However, the optical emission of a laser diode in such a threshold state does not cause a serious problem as long at the duration of the threshold state is in the order of one recording dot or less, in the case the laser diode is used as an optical source of an image formation apparatus such as a laser printer or a digital copier. As noted before, it may be necessary to set this delay time to about 10 ns in the case of using a red laser diode or ultraviolet laser diode.

As noted in FIG. 20G, the present mode of the invention supplies the modulation control current INIT-ON or F1 of FIG. 20F for a very short time, typically of 0.5–5 ns) at the beginning of each modulation current pulse D1. The duration of this modulation control current INIT-ON may be set to the value optimum with regard to the characteristics of the photosensitive body so as to achieve best gradation reproducibility. Further, the magnitude of the current F1 may be set 0.1–1 times the magnitude of the modulation current. When the magnitude of the current F1 is set larger, there is a possibility that the laser diode may be damaged.

FIGS. 21A–21H show another example of operation of the laser driver circuit of FIG. 19.

In the example of FIGS. 21A–21H, it will be noted that the threshold-on current E1 is turned off after the turning off of the modulation current D1 with a slight delay, in view of the difficulty of turning off the threshold-on current E1 and the modulation current D1 exactly with the same timing. As long as the foregoing delay is in the order of several nanoseconds, no practical problem occurs in any of the cases in which the laser diode is used as an optical source of an optical telecommunication system or as an optical source of an image recording apparatus.

In the construction of FIG. 19, too, the modulation current source 13 is initialized according to the construction and procedure explained with reference to FIGS. 10 and 11 and FIGS. 12A–12C.

<Third Mode of the Second Embodiment>

Figure 22:
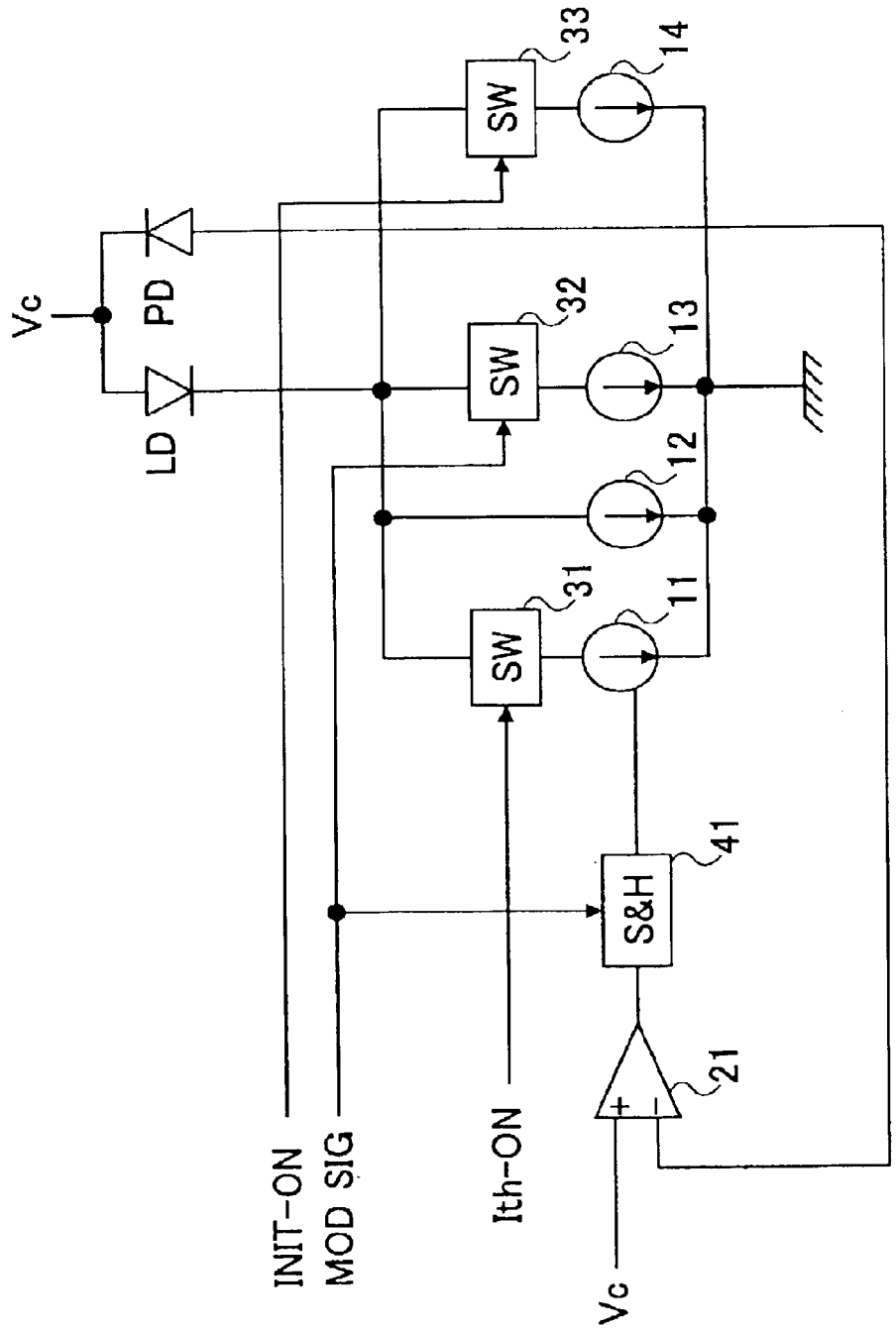
FIG. 22 is a diagram showing another construction mode of the laser driver circuit according to the second embodiment of the present invention.

FIG. 22 shows the construction of the laser driver circuit according to a third mode of the second embodiment, wherein those parts corresponding to the parts described previously are designated by the same reference numerals and the description thereof will be omitted.

Referring to FIG. 22, the laser driver circuit is a modification of the laser driver circuit of FIG. 19 and has a construction similar to that of the laser driver circuit of FIG. 14 in that the sample hold circuit 41 is provided between the comparator 21 and the threshold current source 11, wherein the sample hold circuit 41 is controlled by the modulation signal such that the sampling of the output of the comparator 21 is conducted with the timing in which the modulation signal is on. During the interval in which the modulation signal is off, the sample and hold circuit 41 holds the output of the comparator 21.

Similarly to the circuit of FIG. 19, the laser driver circuit of FIG. 22 includes the auxiliary modulation current source 14 and the switch circuit 33, wherein the switch circuit is controlled in response to the modulation control signal INIT-ON.

According to the construction of FIG. 22, it becomes possible to control the driving power of the laser diode LD not only in the area outside the image recording area but also in the image recording area, by conducting sampling each time the laser diode is turned on.

Further, according to the construction of FIG. 22, the laser driver circuit of the present mode can change the carrier concentration level in the active layer of the laser diode linearly by superimposing the current pulse F1 to the modulation current D1 in correspondence to the leading edge part thereof. Thereby, it becomes possible to realize a high-speed and high-precision laser driver circuit.

<Fourth Mode of the Second Embodiment>

Figure 23:
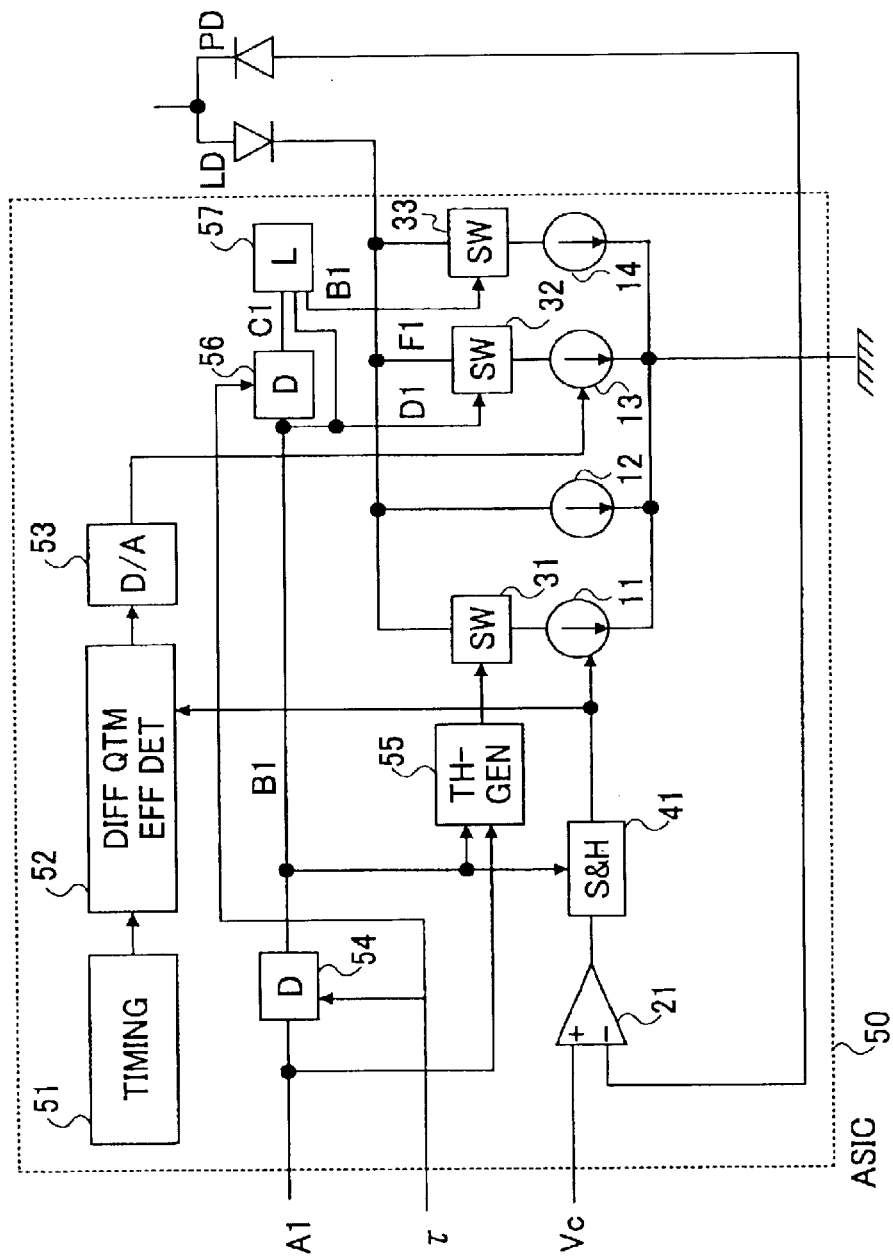
FIG. 23 is a diagram showing another construction mode of the laser driver circuit according to the second embodiment of the present invention.

FIG. 23 shows the construction of the laser driver circuit according to a fourth mode of the second embodiment of the present invention, wherein those parts corresponding to the parts described previously are designated by the same reference numerals and the description thereof will be omitted. It should be noted that the present mode invention represents the case in which the laser driver circuit operating with the timing charts of FIGS. 20A–20H or FIGS. 21A–21H is realized in the form of a single chip ASIC 50.

Referring to FIG. 23, the external command signal A1 of FIG. 20A is converted to the delayed signal B1 of FIG. 20B by providing a delay τ at the delay unit 54, and the delayed signal B1 thus formed is used as the modulation signal D1 of FIG. 20D, wherein the delayed signal D1 is further delayed in a delay unit 56 to form the delayed signal C1 of FIG. 20C. The delayed signals B1 and C1 are supplied to a logic unit 57, wherein the logic value of the delayed signal C1 is inverted, and a logic product is obtained for the delayed signal B1 and the inverted delayed signal C1. As a result, the logic unit 57 produces the modulation control signal F1 shown in FIG. 20F, wherein the signal F1 thus obtained is used to drive the switch 33. It should be noted that the delay unit 54 and the delay unit 57 are controlled by an external delay signal τ.

The modulation signal D1 is used to drive the switch circuit 32 of the modulation current source 13, while the threshold-on signal is used to drive the switch circuit 31 of the threshold current source 11. Further, the control modulation signal F1 is used to drive the switch circuit 33 of the auxiliary modulation current source 14. As a result, there is formed a drive current of the laser diode with a waveform represented in FIG. 20G.

Similarly to FIG. 22, the threshold current is sampled in the on-duration of the modulation signal D1 and is held in the off-duration of thereof. Thereby, the D/A converter 53, which determines the modulation current, controls the modulation current source 13 in response to the timing represented in FIGS. 12A–12C and the laser diode LD is controlled such that there is formed a predetermined optical output.

Similarly to the laser driver circuit of FIG. 22, the laser driver circuit of FIG. 23 can superimpose the current pulse F1 to the modulation current D1 with a magnitude in proportion therewith, and it becomes possible to change the carrier density in the active layer linearly with the modulation current from a very low carrier concentration level, whatever the characteristics of the laser diode may be.

<Fifth Mode of the Second Embodiment>

Figure 24:
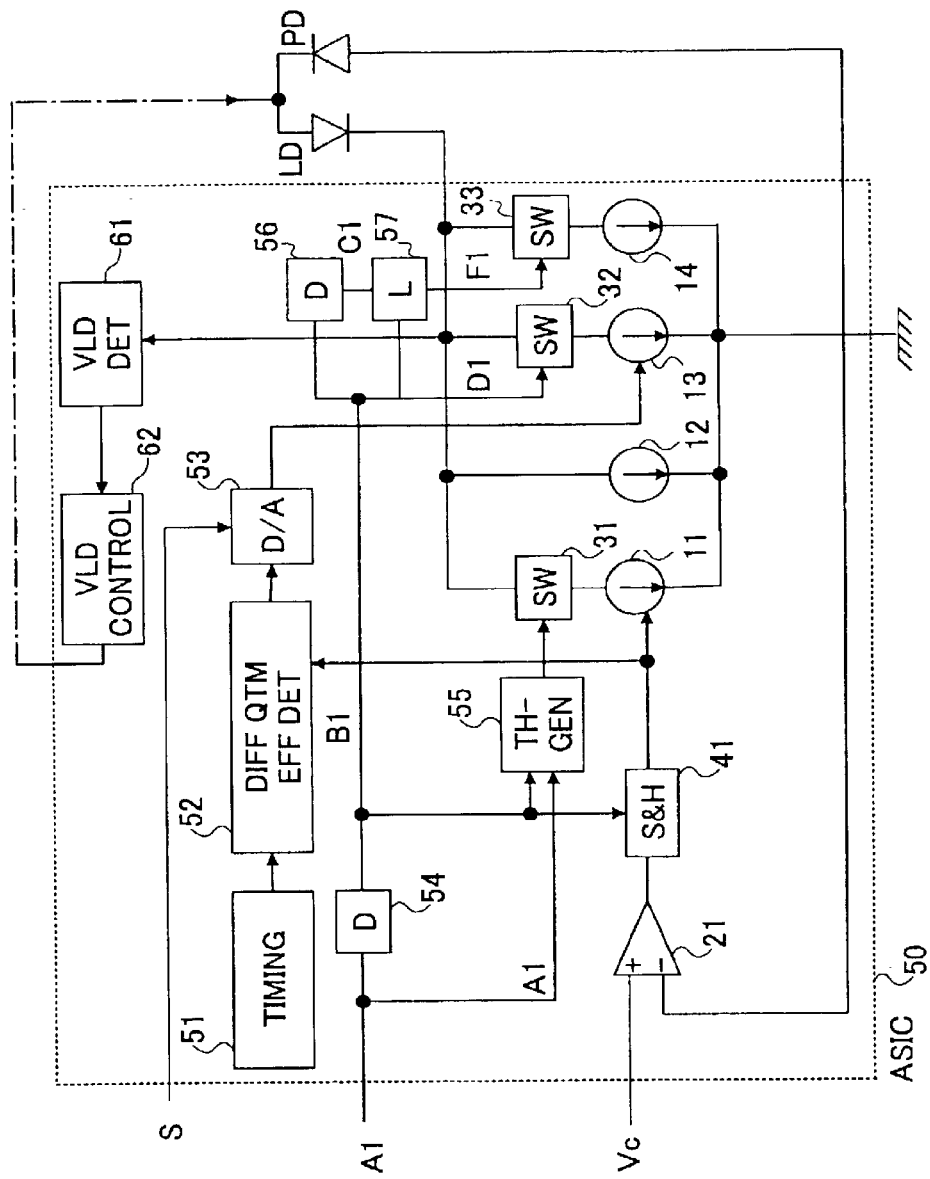
FIG. 24 is a diagram showing another construction mode of the laser driver circuit according to the second embodiment of the present invention.

FIG. 24 shows the construction of a laser driver circuit according to a fifth mode of the second embodiment, wherein those parts corresponding to the parts described previously are designated by the same reference numerals and the description thereof will be omitted.

Referring to FIG. 24, the current value of the D/A converter 53 is changed by the external shading correction control signal S similarly to the mode of FIG. 16, and it becomes possible to carry out shading correction.

Again, the present invention can change the carrier concentration level in the active layer of the laser diode linearly by superimposing the current pulse F1 to the modulation current D1 in correspondence to the leading edge part thereof.

<Sixth Mode of the Second Embodiment>

Figure 25:
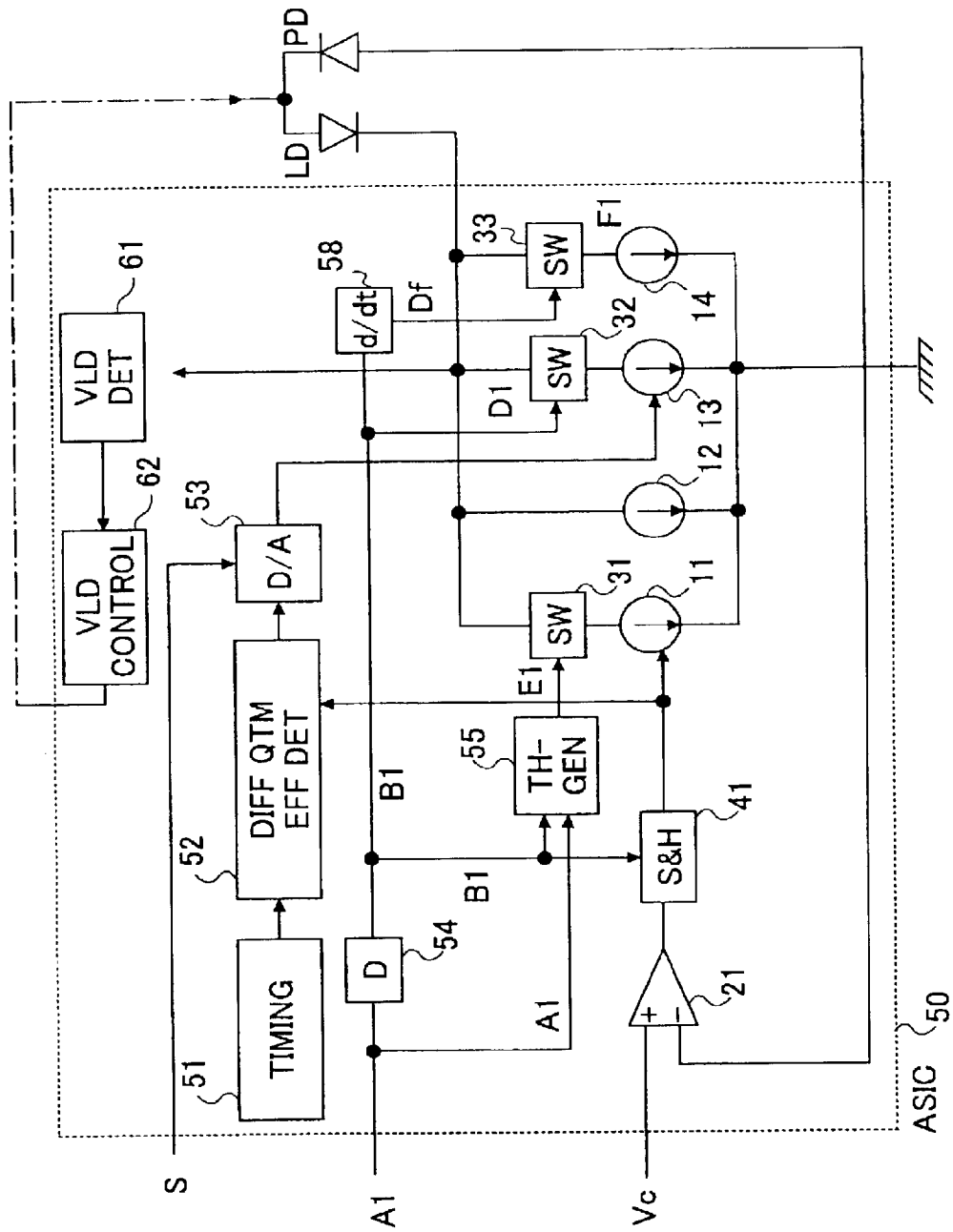
FIG. 25 is a diagram showing another construction mode of the laser driver circuit according to the second embodiment of the present invention.

FIG. 25 shows the construction of a laser driver circuit according to a sixth mode of the present embodiment, wherein those parts corresponding to the parts described previously are designated by the same reference numerals and the description thereof will be omitted.

Referring to FIG. 25, the laser driver circuit has a construction similar to that of FIG. 24, except that a differential element 58 is used for forming the modulation control signal Df from the delayed signal B1 as a differential signal of the signal B1, in place of the delay circuit 56 and the logic circuit 57.

FIGS. 26A–26H are diagrams similar to those of FIGS. 20A–20H or FIGS. 21A–21H and show various waveforms appearing in the circuit of FIG. 25.

Thus, the signal A1 similar of FIG. 26A commands the activation of the laser diode LD, while the signal B1 corresponds to the delayed signal of the signal A1.

Further, FIG. 26C shows the waveform of the differential signal Df produced by the differential element 58, wherein it can be seen that there are formed overshoots characteristic of a differential signal in correspondence to the leading edge and draining edge of the signal B1.

Thus, in the deriver circuit of FIG. 25, the switch circuit 33 is driven by the switch circuit 33 in response to the leading edge of the delayed signal B1, wherein the auxiliary modulation current F1 thus produced is added to the modulation current D1 and the threshold current E1 and the bias current as represented in FIG. 26F.

[Third Embodiment]

Hereinafter, a third embodiment of the present invention will be explained. The present embodiment deals with a temperature change of the laser diode and provides a laser driver circuit that maintains the output power of the laser diode constant when the operational temperature of the laser diode has been changed.

<First Mode of the Third Embodiment>

In the conventional art explained before with reference to FIG. 2, the optical-emission level control signal Vc controlling the optical emission level of the laser diode LD in the activated state thereof and a monitor voltage Vm produced by the photodetector PD are used to form a differential signal, and the differential signal thus formed is used to control the level of optical emission of the laser diode LD at the time of the activated state of the laser diode. Further, a bias level control signal controlling the optical emission level of the laser diode LD in the deactivated state thereof and the operational voltage VLD of the laser diode obtained by converting the drive current of the laser diode LD in the deactivated state by means of the resistor RLD, are used to produce a differential signal, and this differential signal is used to control the optical emission level of the laser diode LD in the deactivated state. Thereby, a high precision control is achieved for the optical-emission level of the laser diode in the activated state by amplifying the monitoring voltage Vm by the amplifier 110, even in such a case the monitoring current Im is very small.

Figure 1:
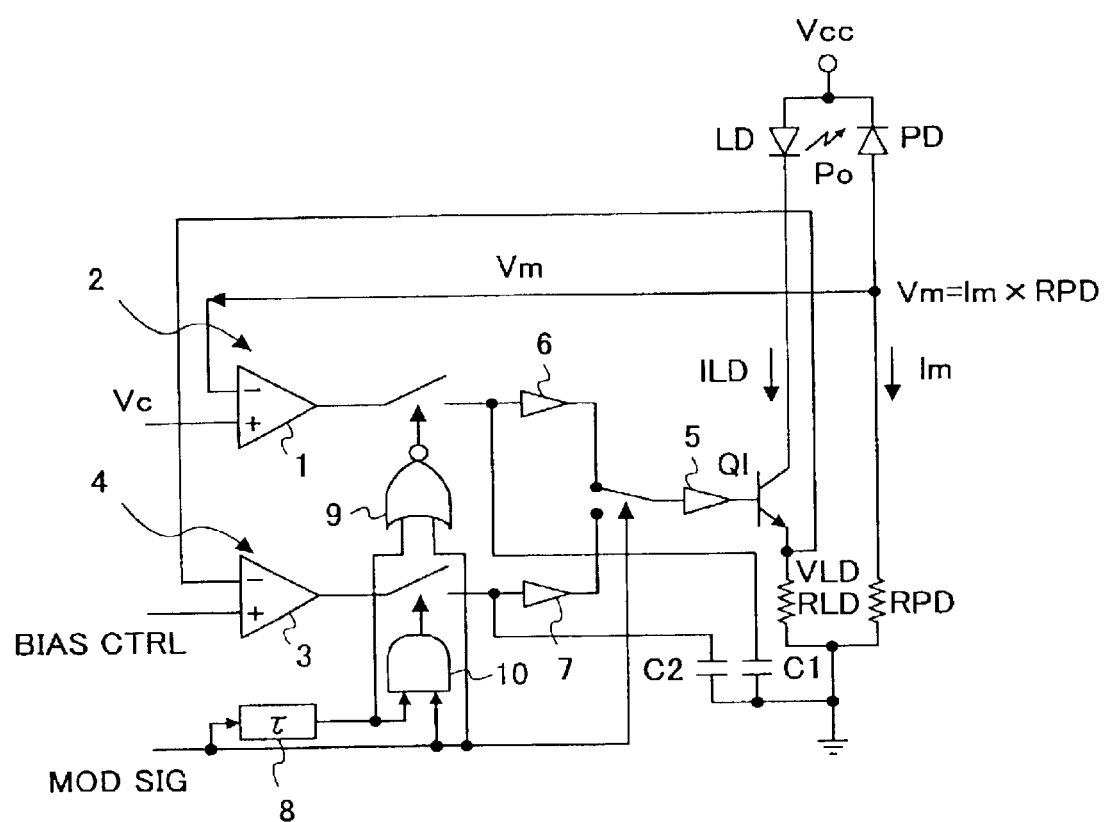
FIG. 1 is a diagram showing the construction of a conventional laser driver circuit.
Figure 2:
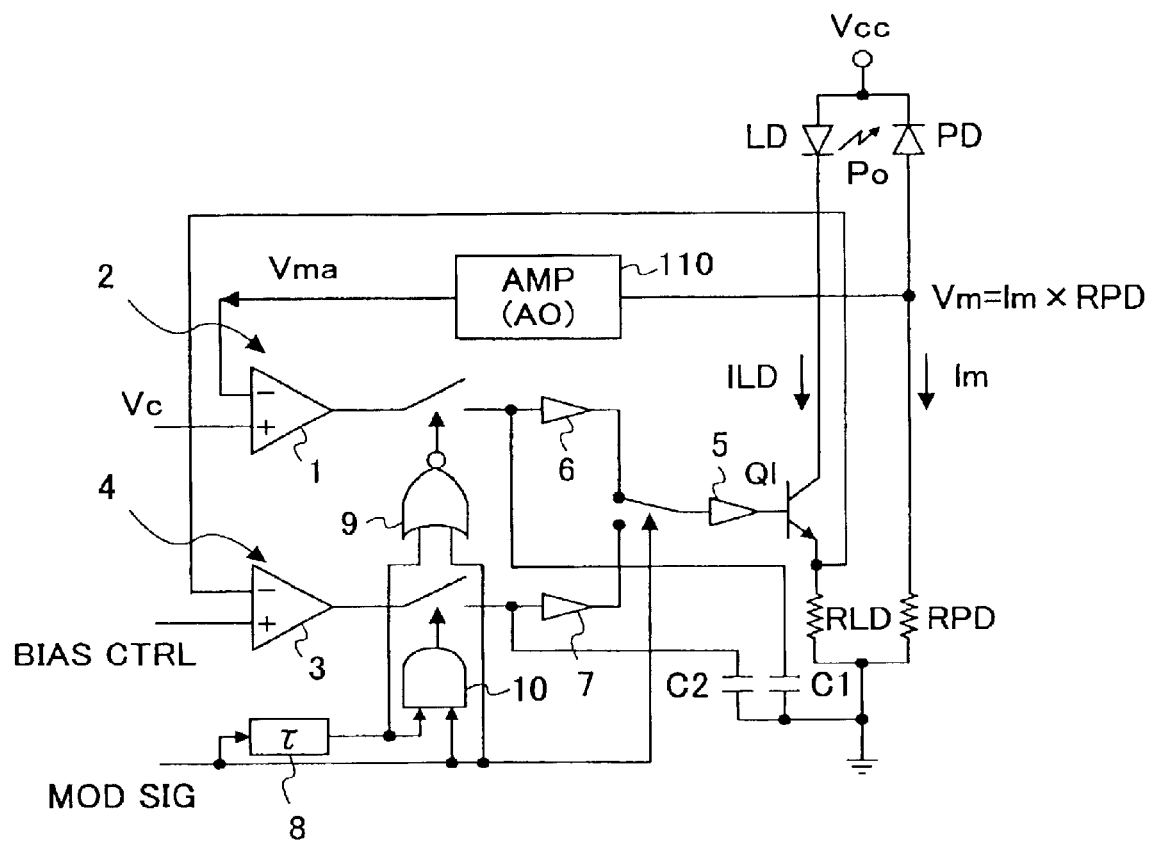
FIG. 2 is a diagram showing the construction of another conventional laser driver circuit.
Figure 27A:
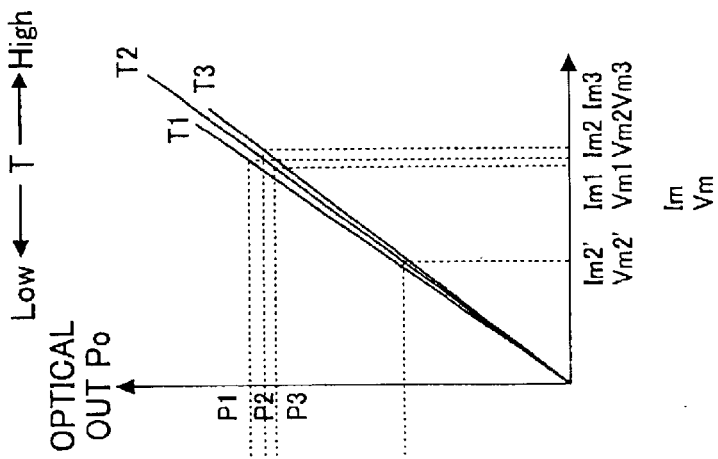
FIGS. 27A and 27B are diagrams showing the principle of the third embodiment.
Figure 27B:
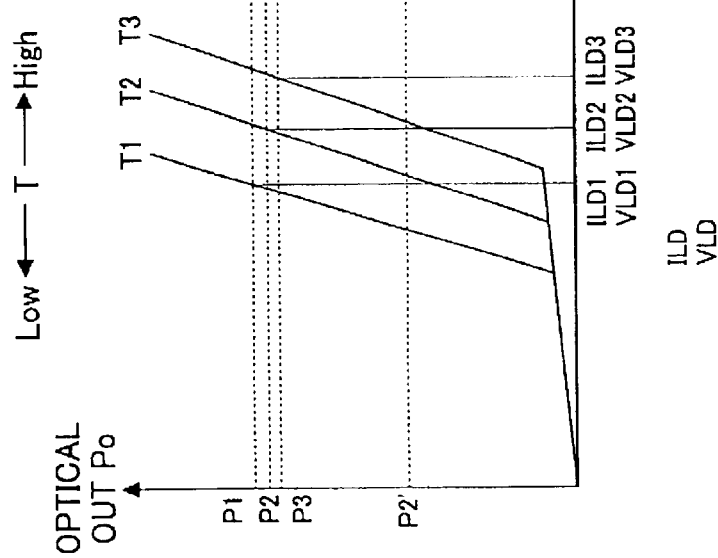

FIG. 27A shows the relationship between the output optical power Po and the drive current ILD or drive voltage VLD of the laser diode LD in the circuit of FIG. 2, while FIG. 27B shows the relationship between the output optical power Po and the monitoring current Im or monitoring voltage Vm of the photodetector PD, wherein both of FIGS. 27A and 27B show the relationship at three temperatures T1, T2 and T3 (T1<T2<T3).

Now, consider the case in which the temperature T2 is a reference temperature and the laser diode LD is driven by setting the optical-emission level control signal Vc to Vc2, such that a desired optical output power P2 is obtained at the reference temperature T2.

At the initial period, the optical-emission control signal Vc2 and the optical-emission level monitoring signal Vma2 are not balanced, and there is applied a control to the laser diode LD to increase or decrease the drive current. Associated therewith, the optical output power of the laser diode is changed.

As a result of the optical output emitted from the laser diode LD, the photodiode PD produces the monitoring current Im, wherein there holds the relationship of Vm2=Im2×RPD at the temperature T2.

Thus, the monitoring voltage Vm2 appearing across the resistor RPD is amplified in the construction of FIG. 2 by the amplifier 110 with an amplification factor A2 to form an amplified signal Vma2 as Vma2=A2×Vm2, wherein the amplification factor A2 is determined such that the amplified monitoring voltage signal Vma is balanced with the optical-emission level control signal Vc2 in the state the laser diode is producing the desired optical output P2.

Further, in the case of obtaining the optical output P2' at the temperature T2 as represented in FIG. 27A, the amplification factor of the amplifier 110 is set to A2' such that the amplified voltage signal Vm2' (=Im2'×RPD) balances with the optical-emission level control signal Vc2' by using the amplified voltage signal Vma2' (=A2'×Vma2').

As long as the temperature of the laser diode is held constant, the monitoring current Im and hence the monitoring voltage Vm become proportional with the optical output of the laser diode LD, and it is possible to achieve the precise control of optical output by way of the voltage Vm or current Im by setting the amplification factor of the amplifier 110 to an appropriate constant.

In the case the temperature has been lowered from T2 to T1, on the other hand, the slope of FIG. 27B is changed, and because of this, it is no longer possible to obtain the desired optical output P2 according to the foregoing feedback control.

Figure 28B:
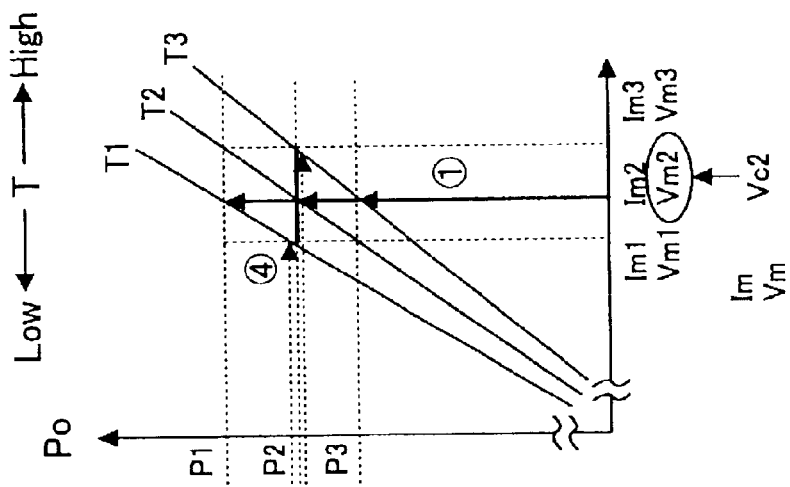
FIGS. 28A and 28B are diagrams showing the principle of the third embodiment.
Figure 28A:
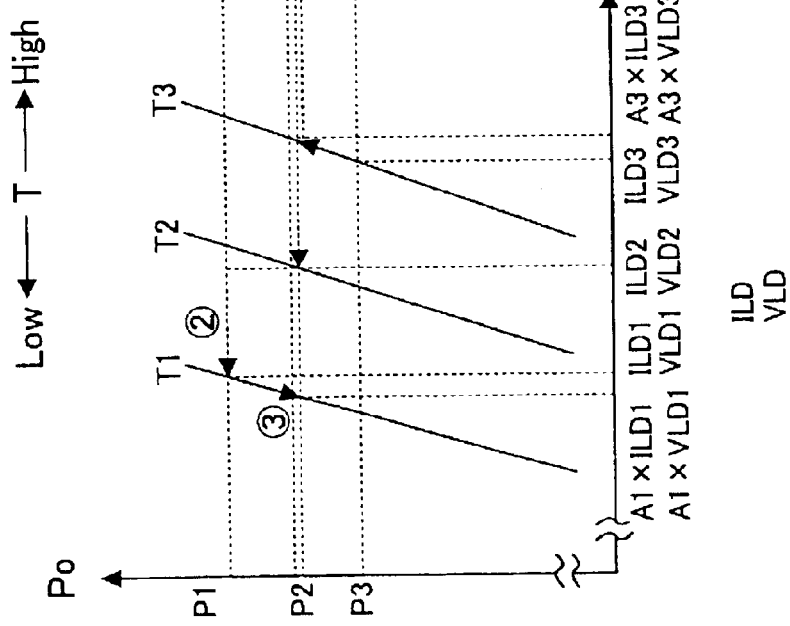

FIGS. 28A and 28B explain the above-noted problem in more detail, wherein FIG. 28A represents FIG. 27A in an enlarged scale while FIG. 28B represents FIG. 27B in an enlarged scale.

As noted above, the feedback control is achieved such the monitoring signal Vma2 balances with the optical-emission control signal Vc2 (Vma2=Vc2) specifying the desired optical output power P2 at the temperature T2 by setting the amplification factor of the amplifier 110 to A2, and the laser diode LD is driven at the optical output power P2 with a drive current ILD2 or drive voltage VLD2.

When the temperature is lowered to T1, on the other hand, the slope of FIG. 28B is changed, and the laser diode LD produces the optical power P1 when the monitoring voltage Vma2 is controlled so as to balance with the optical emission control voltage Vc2 as a result of driving of the laser diode LD with the drive current ILD1 or with the drive voltage VLD1, and there arises a deviation of optical output of the laser diode LD from the desired power P2 to a larger power P1.

A similar problem arises when the temperature has risen from T2 to T3 as represented also in FIG. 28B, and the optical output power of the laser diode is changed from the desired power P2 to a smaller power P3 as a result of driving of the laser diode LD with a drive current ILD3 or the drive voltage VLD3.

Figure 29:
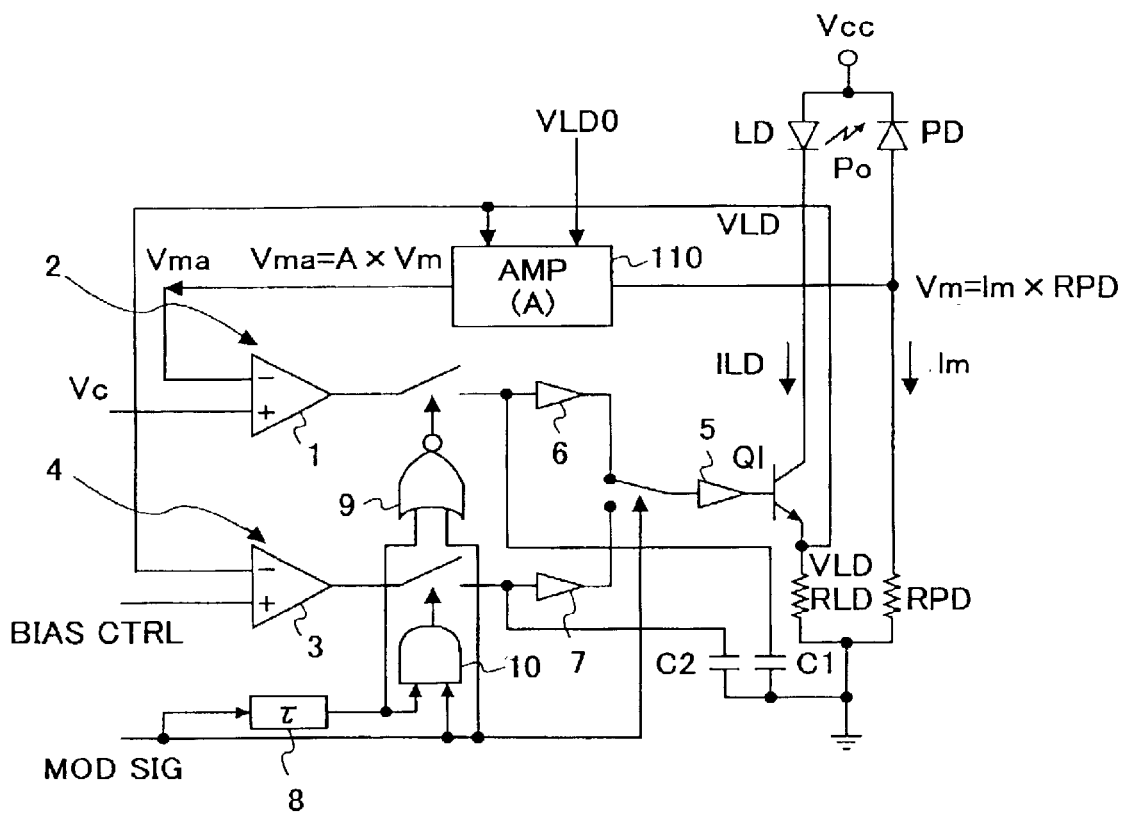
FIG. 29 is a diagram showing the construction of a laser driver circuit according to a third embodiment of the present invention.

In order to eliminate the foregoing problems, the present embodiment-proposes a laser driver circuit as represented in FIG. 29, wherein those parts corresponding to the parts described previously are designated by the same reference numerals and the description thereof will be omitted.

Referring to FIG. 29, it should be noted that the amplification factor of the amplifier 110 is controlled in response to a reference temperature signal VLDO and the drive voltage VLD of the laser diode LD.

Thus, at the temperature T2, there holds the relationship Vc2=Vma2=A2×Vm2=A2×Im2×RPD, and the laser output power is controlled to P2 as noted before.

When the temperature has lowered from T2 to T1, on the other hand, there is caused a change of slope in the relationship of FIG. 28B as noted before, and the comparator 2 attempts to control the laser diode LD to produce the output power P1 (P1>P2) as represented as ② in FIG. 28A, in response to the monitoring current Im2 represented as ① in FIG. 28B, provided that the amplification factor of the amplifier 110 is set to A2, as noted before.

Now, in the driver circuit of FIG. 29, the amplification factor of the amplifier 110 is reduced from A2 to A1, and thus, the laser output power of the laser diode LD is reduced from P1 to P2 as represented in FIG. 28A as ③.

In response thereto, the photodiode PD produces a monitoring current Im1 (Im1<Im2) as represented as ④ in FIG. 28B, and the feedback loop operation of the laser driver circuit converges. At the condition ④, it should be noted that there holds the relationship Vm1×A1=Vma1=Vc2.

A similar loop operation is caused when the temperature has increased from T2 to T3, and there holds the relationship Vm3×A3=Vma3=Vc2. Thereby, the laser diode LD produces the output power of P2 at the operational temperature of T3.

Figure 30A:
FIGS. 30A–30E are diagrams showing the operation of the laser driver circuit of FIG. 29.
Figure 30B:

FIGS. 30A–30E show the waveform of various signals in the laser driver circuit of FIG. 29 for the case of driving the laser diode LD at the temperature T2, wherein FIG. 30A shows the waveform of the modulation signal MOD SIG, while FIG. 30B shows the waveform of the optical-emission control signal obtained by delaying the modulation signal of FIG. 30A with a delay time τ by the delay circuit 8.

Figure 30C:
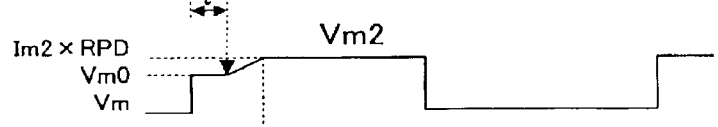

FIG. 30C, on the other hand, shows the waveform of the monitoring signal Vm2 appearing across the resistor RPD, wherein it will be noted that the Vm2 is changed from the initial value Vm0 with time as a result of the negative feedback loop operation of the laser driver circuit.

Figure 30D:

FIG. 30D, on the other hand, shows the waveform of the output voltage signal Vma (=A2×Vm2) of the amplifier 110, wherein it will be noted that the output voltage signal Vma starts from the initial value of Va0 and converges to the value of Vc2 as a result of the feedback operation of the laser driver circuit.

Figure 30E:
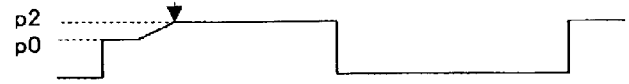

Further, FIG. 30E shows the waveform of the optical output produced by the laser diode LD. It will be noted that the output power of the laser diode starts from P0 and approaches the designated value P2 as a result of the feedback operation of the laser driver circuit.

Figure 31A:
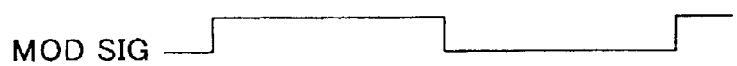
FIGS. 31A–31E are diagrams showing another example of operation of the laser driver circuit of FIG. 29.
Figure 31B:

FIGS. 31A–31E show the waveform of various signals in the laser driver circuit of FIG. 29 for the case of driving the laser diode LD at the temperature T1, wherein FIG. 31A shows the waveform of the modulation signal MOD SIG, while FIG. 31B shows the waveform of the optical-emission control signal obtained by delaying the modulation signal of FIG. 31A with a delay time τ by the delay circuit 8. The signals of FIGS. 31A and 31B are identical with the signals of FIGS. 30A and 30B noted before.

Figure 31C:
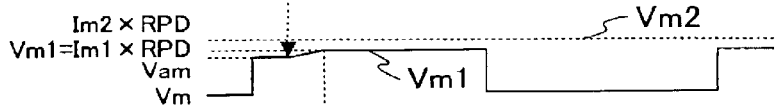

FIG. 31C, on the other hand, shows the waveform of the monitoring signal Vm1 appearing across the resistor RPD, wherein it will be noted that the Vm1 is changed from the initial value Vam with time as a result of the negative feedback loop operation of the laser driver circuit. Thus, the voltage Vm1 is controlled to a value smaller than the voltage Vm2 of FIG. 30C.

Figure 31D:

FIG. 31D, on the other hand, shows the waveform of the output voltage signal Vma (=A1×Vm1) of the amplifier 110, wherein it will be noted that the output voltage signal Vma starts from the initial value of Va0 and converges to the value of Vc2 as a result of the feedback operation of the laser driver circuit.

Figure 31E:

Further, FIG. 31E shows the waveform of the optical output produced by the laser diode LD. It will be noted that the output power of the laser diode starts from P0 and approaches the designated value P2 as a result of the feedback operation of the laser driver circuit.

FIGS. 32A–32E show the waveform of various signals in the laser driver circuit of FIG. 29 for the case of driving the laser diode LD at the temperature T3, wherein FIG. 32A shows the waveform of the modulation signal MOD SIG, while FIG. 32B shows the waveform of the optical-emission control signal obtained by delaying the modulation signal of FIG. 32A with a delay time τ by the delay circuit 8. The signals of FIGS. 32A and 32B are identical with the signals of FIGS. 30A and 30B noted before.

FIG. 32C, on the other hand, shows the waveform of the monitoring signal Vm3 appearing across the resistor RPD, wherein it will be noted that the voltage signal Vm3 is changed from the initial value Vmm with time as a result of the negative feedback loop operation of the laser driver circuit and is controlled to a value larger than the voltage Vm2 of FIG. 30C.

FIG. 32D, on the other hand, shows the waveform of the output voltage signal Vma (=A3×Vm3) of the amplifier 110, wherein it will be noted that the output voltage signal Vma starts from the initial value of Va0 and converges to the value of Vc2 as a result of the feedback operation of the laser driver circuit.

Further, FIG. 32E shows the waveform of the optical output produced by the laser diode LD. It will be noted that the output power of the laser diode starts from P0 and approaches the designated value P2 as a result of the feedback operation of the laser driver circuit.

Thus, in the present embodiment, the amplification factor of the amplifier 110 is changed in response to the difference between the voltage signal VLD of the laser diode and a constant voltage VLD0, and thus in response to the voltage signal VLD, wherein it should be noted that the voltage signal VLD changes depending on the operational temperature of the laser diode. See the relationship of FIG. 27A.

Thus, the voltage signal VLD is regarded as a temperature signal of the laser diode in the present embodiment, and it becomes possible to achieve the foregoing temperature compensation operation without using a separate temperature sensor or a similar temperature-sensing element.

<Second Mode of the Third Embodiment>

Figure 33:
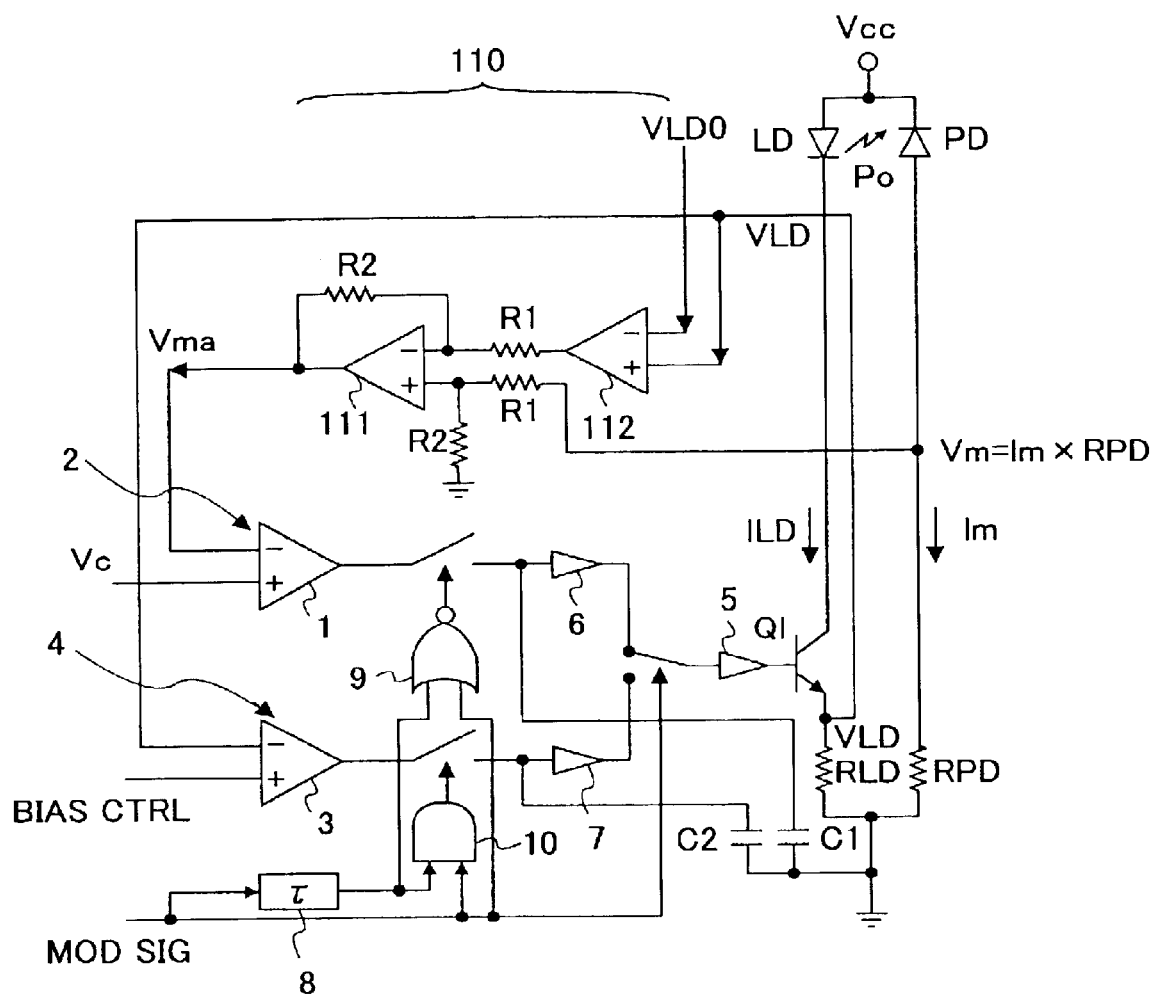
FIG. 33 is a diagram showing another construction mode of a laser driver circuit according to the third embodiment of the present invention.

FIG. 33 shows the construction of a laser driver circuit according to a second mode of the present invention, wherein those parts corresponding to the parts described previously are designated by the same reference numerals and the description thereof will be omitted.

Referring to FIG. 33, the laser driver circuit uses operational amplifiers 111 and 112 for realizing the amplifier 110, wherein the operational amplifier 112 subtracts the reference temperature signal VLD0 from the operational voltage VLD and produces an output signal indicative of the difference. The output signal of the operational amplifier 112 is then used for setting up the amplification factor of the operational amplifier 111.

More specifically, the output of the operational amplifier 112 is supplied to the inverting input terminal of the operational amplifier via a resistor having a resistance R1, wherein a resistor having a resistance R2 is provided so as to connect the inverting input terminal of the operational amplifier 111 to an output terminal thereof. Further, the operational amplifier 111 is supplied with the monitoring voltage signal Vm via a resistor having a resistance R1 at a non-inverting input terminal thereof, wherein another resistor having the resistance R2 is provide between the non-inverting input terminal of the operational amplifier 111 and the ground.

In the amplifier 110 thus formed with the operational amplifiers 111 and 112, the monitoring voltage signal Vm is amplified with the relationship Vma=(R2/R1){(VLD−VLD0)−Vm}, and thus, the amplification factor of the amplifier 111 is determined by the value of the resistances R1 and R2.

Again, the present mode of FIG. 33 eliminates the necessity of using expensive temperature sensor, and the like, and the high-precision feedback operation for temperature compensation is realized with low cost.

<Third Mode of the Third Embodiment>

Figure 34:
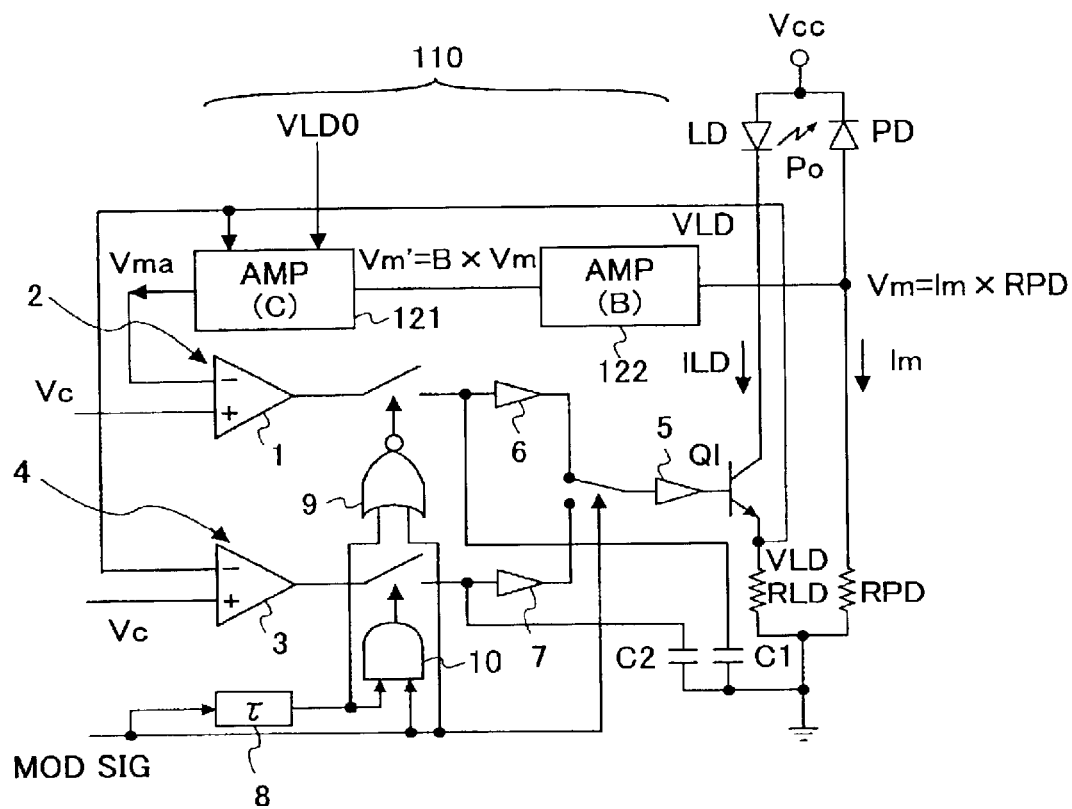
FIG. 34 is a diagram showing another construction mode of a laser driver circuit according to the third embodiment of the present invention.

FIG. 34 shows the construction of a laser driver circuit according to a third mode of the third embodiment, wherein those parts corresponding to the parts described previously are designated by the same reference numerals.

Referring to FIG. 34, the amplifier 110 is now formed of a first amplifier 121 amplifying the monitoring voltage signal Vm with an amplification factor B to produce a voltage signal Vm' and a second amplifier 122 supplied with the voltage signal VLD and the reference temperature voltage signal VLD0 and amplifying the output voltage signal Vm' of the amplifier 121 with an amplification factor C determined in response to the difference between the voltage signal VLD and the temperature reference signal VLD0.

Figure 35:
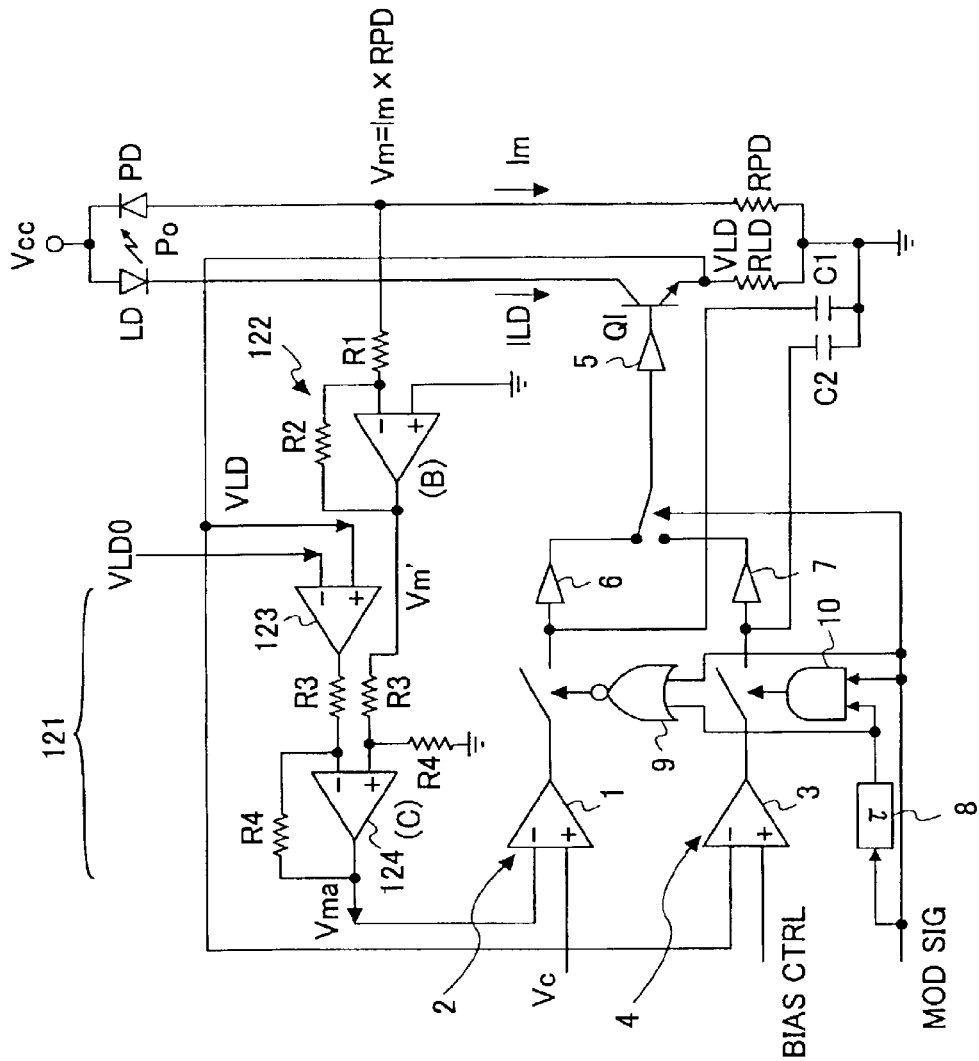
FIG. 35 is a diagram showing another construction mode of a laser driver circuit according to the third embodiment of the present invention.

FIG. 35 shows the laser driver circuit of FIG. 34 in more detail.

Referring to FIG. 35, the amplifier 122 is formed of an operational amplifier 122 supplied with the monitoring voltage signal Vm via a resistor having the resistance R1 at an inverting input terminal thereof, wherein a resistor having the resistance R2 is provided so as to connect the inverting input terminal of the operational amplifier 122 to an output terminal thereof. Thereby, the resistors R1 and R2 are set so as to provide the amplification factor B, and the operational amplifier 122 produces the output voltage Vm' determined as $$Vm' = -(R2/R1) \times Vm.$$

On the other hand, the amplifier 121 is formed of an operational amplifier 123 and an operational amplifier 124, wherein the operational amplifier 123 is supplied with the voltage signal VLD and the temperature reference voltage signal VLD0 and produces an output signal corresponding to the difference thereof, while the operational amplifier 124 is supplied with the output of the operational amplifier 123 at an inverting input terminal thereof via a resistor having a resistance R3 and the output signal Vm' of the operational amplifier 123 at a non-inverting input terminal thereof via a resistor having the resistance R3.

The non-inverting input terminal of the operational amplifier 124 is connected to the ground via a resistor having a resistance R4 while the inverting input terminal of the operational amplifier 124 is connected to an output terminal thereof via a resistor having the resistance R4.

Thereby, the operational amplifier 124 produces an output voltage Vma according to the relationship $$Vma=(R4/R3)\{(VLD-VLD0)-Vm'\},$$

wherein the resistances R3 and R4 are determined such that R4/R3 is equal to the amplification factor C.

In view of the fact that Vm' is given as $$Vm'=-(R2/R1)\times Vm$$

as noted before, the voltage signal Vma' is obtained as $$Vma=(R4/R3)\{(VLD-VLD0)+(R2/R1)\times Vm\}.$$

Again, the present invention can achieve the temperature compensation in the negative feedback operation of the laser driving without using a temperature sensor. Thereby, a high-precision control becomes possible by amplifying the monitoring voltage signal Vm' by the amplifier 122.

<Fourth Mode of the Third Embodiment>

Figure 36:
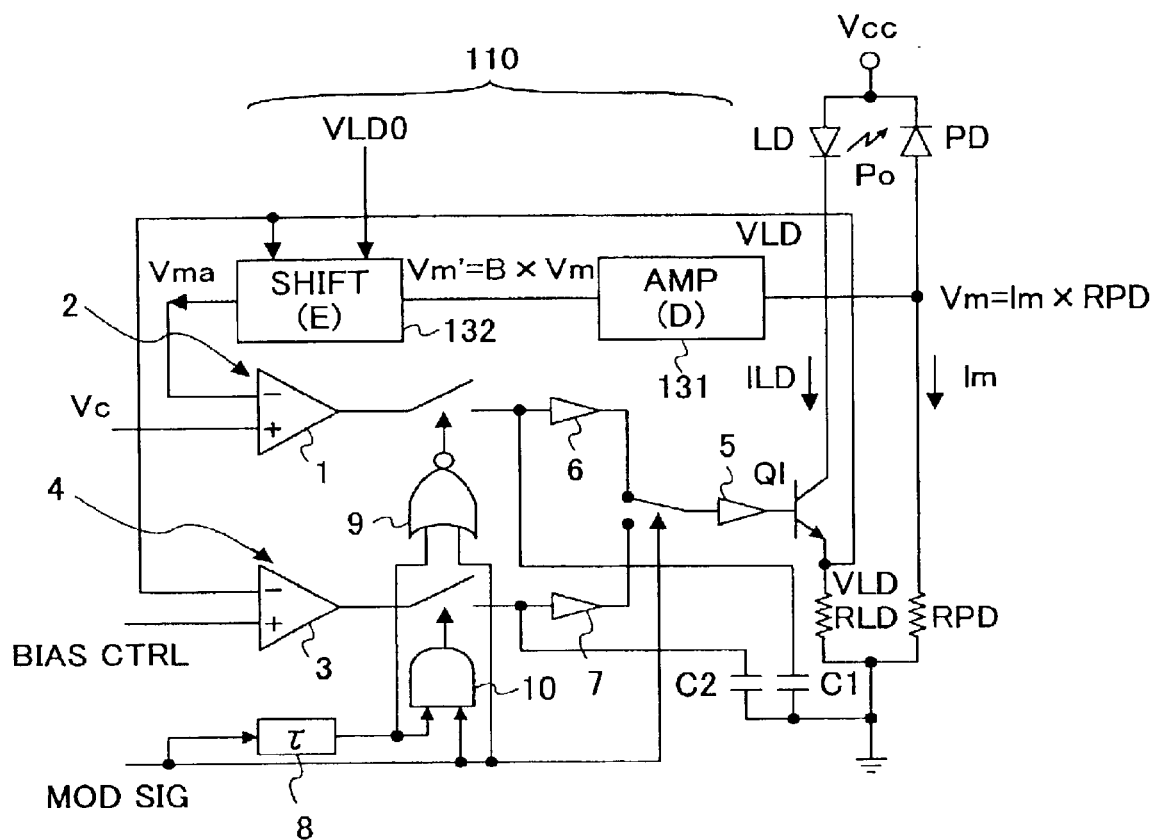
FIG. 36 is a diagram showing another construction mode of a laser driver circuit according to the third embodiment of the present invention.

FIG. 36 shows the construction of a laser driver circuit according to a fourth mode of the present embodiment, wherein those parts corresponding to the parts described previously are designated by the same reference numerals and the description thereof will be omitted.

Referring to FIG. 36, the amplifier 110 is now formed of an amplifier 131 amplifying the monitoring voltage signal Vm with an amplification factor D to produce a voltage signal Vm' and a voltage shifter 132 supplied with the voltage signal VLD and the reference temperature voltage signal VLD0 and increasing or decreasing the output voltage signal Vm' of the amplifier 121 with a voltage shift E determined in response to the difference between the voltage signal VLD and the temperature reference signal VLD0. The voltage shifter 132 has an amplification factor of one and does not amplify or de-amplify the monitoring voltage signal Vm'. It should be noted that the voltage shifter 132 increases the monitoring voltage Vm' when the voltage shift E is positive, while the amplifier 132 decreases the monitoring voltage Vm' when the voltage shift E is negative. When the voltage shift E is zero, the voltage shifter 132 provides the monitoring voltage Vm' as the output signal without a voltage shift.

By shifting the monitoring voltage signal Vm' in the voltage shifter 132 in response to the temperature, the laser driver circuit of the present embodiment can achieve a high-precision compensation of temperature dependence in the negative feedback control operation.

Figure 37:
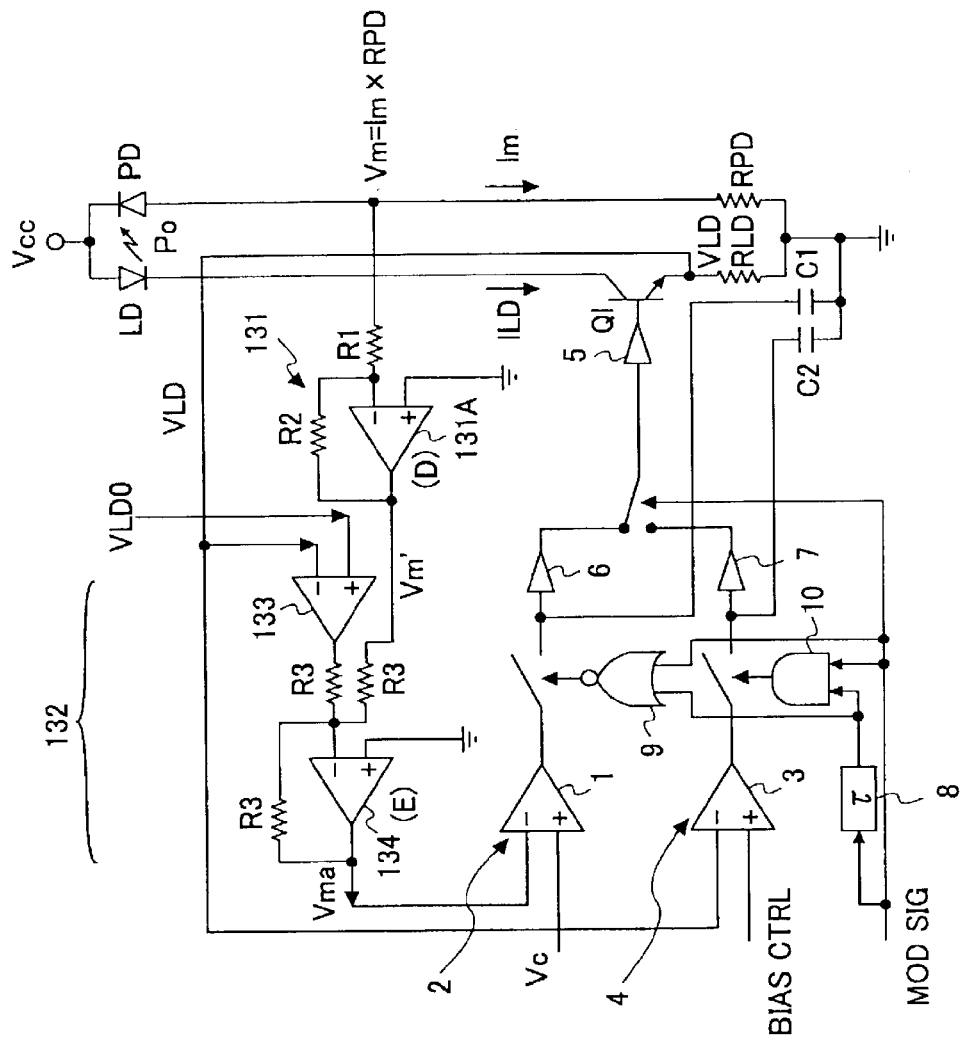
FIG. 37 is a diagram showing another construction mode of a laser driver circuit according to the third embodiment of the present invention.

FIG. 37 shows the construction of the laser driver circuit of FIG. 36 in more detail.

Referring to FIG. 37, the amplifier 131 has a construction similar to the one explained with reference to FIG. 35 and includes an operational amplifier 131A amplifying the monitoring voltage signal Vm' with the predetermined amplification factor D determined by the resistances R1 and R2, such that there holds the relationship $$Vm'=-(R2/R1)\times Vm.$$

On the other hand, the voltage shifter 132 includes an operational amplifier 133 and an operational amplifier 134 wherein the operational amplifier 133 has a construction similar to that of the operational amplifier 123 of FIG. 35 and produces an output signal corresponding to the difference between the voltage signal VLD and the temperature reference voltage signal VLD0.

The operational amplifier 134 is thereby supplied with the output of the operational amplifier 133 via a resistor having the resistance R3 at an inverting input terminal, while the non-inverting input terminal of the operational amplifier 134 is connected to the ground. Further, the output voltage Vm' of the operational amplifier 131 is supplied to the foregoing inverting input terminal of the operational amplifier 134 via a resistor having the resistance R3, wherein the inverting input terminal of the operational amplifier 134 is connected to an output terminal thereof via a resistor also having the resistance R3.

Thereby, it should be noted that the amplification factor of the operational amplifier 134 is one and the operational amplifier 134 produces an output voltage Vma according to the relationship:

$$Vma=-(VLD0-VLD)-Vm',$$

or $$Vma=-(VLD0-VLD)+(R2/R1)\times Vm.$$

Thus, when the temperature of the laser diode LD has lowered, the voltage VLD is decreased and the value of the monitoring voltage signal Vm' is decreased, while when the temperature of the laser diode LD has increased, the voltage VLD of the laser diode is increased and value of the monitoring voltage signal Vm' is increased.

<Fifth Mode of the Third Embodiment>

Figure 38A:
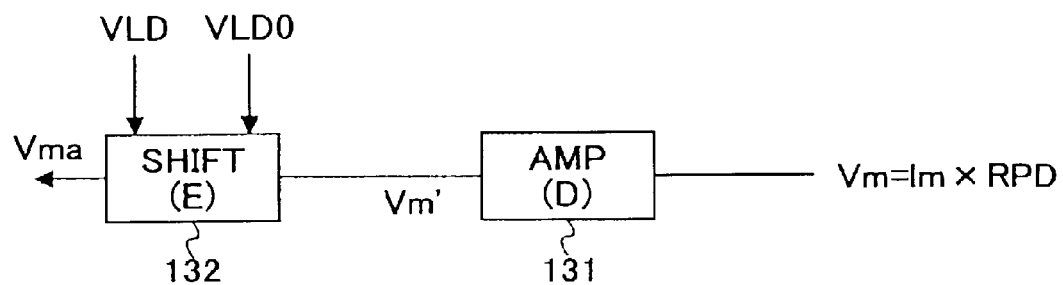
FIGS. 38A and 38B are diagrams showing another construction mode of a laser driver circuit according to the third embodiment of the present invention.
Figure 38B:
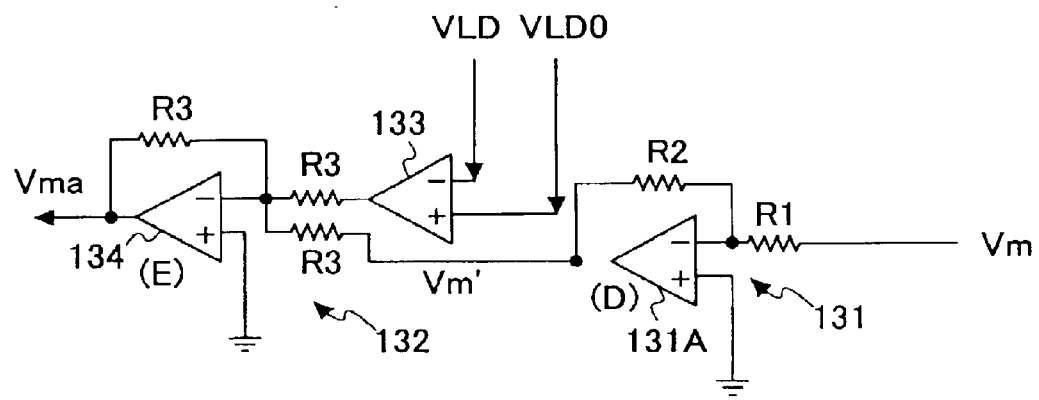

Next, a fifth mode of the present embodiment will be explained with reference to FIGS. 28A and 28B and FIGS. 38A and 38B, wherein the present embodiment is related to the determination of the voltage shift E in the previous embodiment. Thus, FIG. 38A shows a part of FIG. 36 including the amplifier 131 and the voltage shifter 132, while FIG. 38B shows a corresponding part of FIG. 37. In FIGS. 38A and 38B, those parts corresponding to the parts explained already are designated by the same reference numerals and the description thereof will be omitted.

Similarly to the previous mode, the present mode sets the voltage shift E to zero when the difference between the reference temperature voltage signal VLD0 and the laser operational voltage VLD is zero, wherein the voltage shift E is set positive or negative in response to the difference between the voltage signals VLD0 and VLD.

In the mode of FIG. 36 or 37, the monitoring voltage Vm is amplified with the amplification factor D of the amplifier 131, while the voltage shift E is determined by the voltage shifter 30 solely from the difference between the reference temperature voltage signal VLD0 and the laser operational voltage VLD, such that the voltage signal Vma equal to Vc is obtained ultimately.

FIGS. 28A and 28B represent the laser output characteristic and photodiode output characteristic driven by the laser driver circuit of FIG. 36 or 37.

Assuming that the reference temperature voltage signal VLD0 and the operational voltage VLD balances at the temperature T2 (E=0), and there is caused no shift of voltage Vma. Thus, the voltage Vma includes only the effect of amplification of the monitoring voltage Vm in the amplifier 131 with the amplification factor of D.

When the temperature has increased from T2 to T3, on the other hand, the laser driver circuit drives the laser diode LD with the drive voltage VLD3, which is larger than the operational voltage level VLD2 (=VLD0), and thus, the laser diode LD is driven with the optical output power P3, which is smaller than the desired optical output power P2.

Thus, the voltage shift E produced by the voltage shifter 134 is determined to have a negative value such that the monitoring current Im, and hence the monitoring voltage Vm, has an increased value and the voltage signal Vma balances with the optical-emission control signal Vc in the state the monitoring current Im of the photodiode PD takes the value Im3. Thereby, the laser diode LD produces the output power P2.

In the case the temperature of the laser diode LD has decreased to T1 from the temperature T2, on the other hand, and thus, the laser diode LD is driven with the optical output power P1, which is larger than the desired optical output power P2.

Thus, the voltage shift E produced by the voltage shifter 134 takes a positive value such that the monitoring current Im, and hence the monitoring voltage Vm, has an decreased value and the voltage signal Vma balances with the optical-emission control signal Vc in the state the monitoring current Im of the photodiode PD takes the value Im1. Thereby, the laser diode LD produces the output power P2.

According to the present mode of the invention, only the voltage shifter 134 is adjusted with respect to the voltage shift E, and thus, a high precision control of laser output power is achieved.

While not illustrated, it is also possible to change the amplification factor C, in the construction of FIG. 34 or 35, such that the amplification factor C takes the value 1 when the difference between the reference temperature signal VLD0 and the laser operational voltage VLD is zero and such that the amplification factor C takes a value larger than 1 (C>1) when the voltage signal VLD0 is larger than the voltage VLD and a value smaller than 1 (C<1) when the voltage signal VLD is smaller than the voltage VLD.

Thus, in the construction of FIG. 34 or 35, too, it is possible to perform a high-precision temperature compensation operation in the feedback loop operation of the laser driver circuit.

<Sixth Mode of the Third embodiment>

Next, a sixth mode of the third embodiment will be explained again with reference to FIGS. 38A and 38B.

The present mode, too, is related to the determination of the voltage shift E of the voltage shifter 30 having a construction shown in FIG. 36 or 37.

In the present mode, the difference signal between the reference temperature voltage signal VLD0 and the laser operational voltage VLD is obtained and the voltage shift E is determined in response to the foregoing difference signal such that the voltage shift E becomes zero when the differential signal takes the maximum value or minimum value. Thereby, the voltage shift E takes only a positive value or a negative value depending on the value of the differential signal.

According to the present mode of the invention, the voltage shift E takes any of a positive value or a negative value, and the correction of the feedback control is facilitated. Thereby, it becomes possible to achieve a high-precision control of optical power of the laser diode.

For example, in the case of setting the voltage shift E to zero (E=0) in the state the difference signal takes the minimum value (VLD0−VLD=MIN), the voltage shift E takes a positive value whenever the difference signal is larger than the foregoing minimum value, (VLD0−VLD>MIN). Thus, in the case of setting the foregoing minimum value MIN to correspond to the lower limit of the operational temperature of the laser diode LD, the voltage shifter 132 is required to merely add a positive value to the monitoring voltage Vm', and the temperature compensation conducted by the voltage shifter 30 is simplified substantially.

In the case of setting the voltage shift E to zero (E=0) in the state the difference signal takes the maximum value (VLD0−VLD=MAX), on the other hand, the voltage shift E takes a negative value whenever the difference signal is smaller than the foregoing maximum value (VLD0−VLD<MAX). Thus, in the case of setting the foregoing maximum value MAX to correspond to the upper limit of the operational temperature of the laser diode LD, the voltage shifter 132 is required to merely add a negative value to the monitoring voltage Vm', and the temperature compensation conducted by the voltage shifter 30 is simplified substantially. Again, it is possible to change the amplification factor C, in the construction of FIG. 34 or 35, such that the amplification factor C takes the value 1 when the voltage difference VLD0−VLD takes the maximum or minimum. Thereby, the amplification factor C takes a value larger than 1 or smaller than one when the foregoing difference voltage VLD0−VLD takes a value larger than the minimum value MIN or smaller than the maximum value MAX.

<Seventh Mode of the Third Embodiment>

Next, a seventh mode of the present embodiment will be explained with reference to FIGS. 39A and 39B, wherein the present mode of the invention sets the reference temperature corresponding to the reference temperature signal VLD0 to be generally at the enter of the operational temperature of the laser diode.

Thus, according to the present mode of the invention, the voltage shift E or the amplification factor C is determined based on the difference between the reference temperature voltage signal VLD0 and the operational voltage VLD, wherein the present mode defines the zero state of the difference voltage when the temperature of the laser diode LD is at the center of the operational temperature range of the laser diode LD.

At the center temperature of the operational temperature range of the laser diode, therefore, the voltage shift E provided by the voltage shifter 132 or 134 is set zero when the laser operational temperature is at the foregoing center temperature, and only the amplification by the amplifier 131 is achieved as long as the temperature of the laser diode LD is in the ordinary operational temperature range.

FIG. 39A shows the relationship between the optical output power of the laser diode and the drive current similar to the one shown in FIG. 28A, while FIG. 39B shows the relationship between the output optical power of the laser diode as detected by the photodetector PD and the monitoring current Im or voltage Vm obtained by the photodetector PD.

Thus, when the temperature of the laser diode LD is higher than the reference temperature T2, which is located generally at the center of the operational temperature range of the laser diode LD, the voltage shift E takes a positive value with a magnitude determined in response to the deviation of the temperature from the foregoing reference temperature T2. In the case the operational temperature of the laser diode LD is lower than the reference temperature T2, on the other hand, the voltage shift E takes a negative value with a magnitude determined in response to the deviation of the temperature from the foregoing reference temperature T2. Thus, by determining the magnitude of the voltage shift E as a function of the temperature deviation from the foregoing reference temperature T2, it becomes possible according to the present mode to compensate for the effect of temperature change in the feedback loop operation of the laser diode about the foregoing center temperature T2.

It should be noted that a similar control of the amplification factor C is possible for the amplifier 121 in the construction of FIG. 33 or FIG. 34.

<Eighth Mode of the Third Embodiment>

Next, an eighth mode of the present embodiment will be explained with reference to FIGS. 40A and 40B, wherein the present mode is based on the construction of FIG. 34 or 35 and sets the reference temperature corresponding to the reference temperature signal VLD0 to be generally at the lower edge temperature (T1) of the operational temperature range of the laser diode LD. Further, the present mode defines the minimum value of the amplification factor C to be equal to one at the foregoing lower limit temperature T1.

Figure 40A:
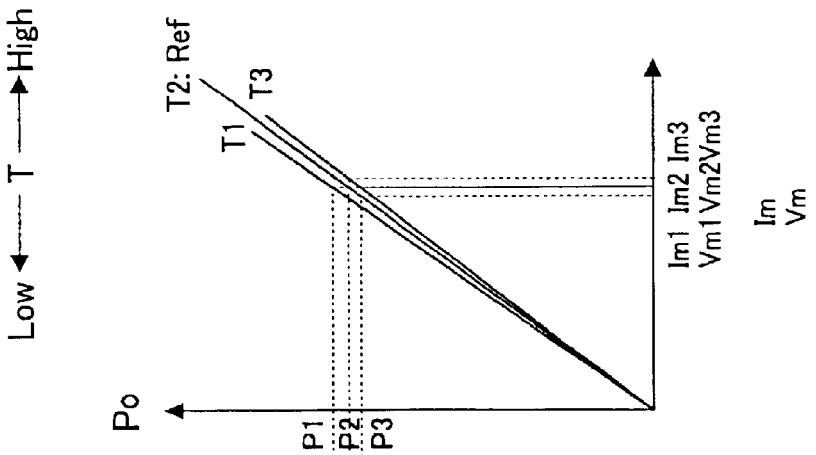
FIGS. 40A and 40B are diagrams explaining the principle of the laser driver circuit of the third embodiment.
Figure 40B:
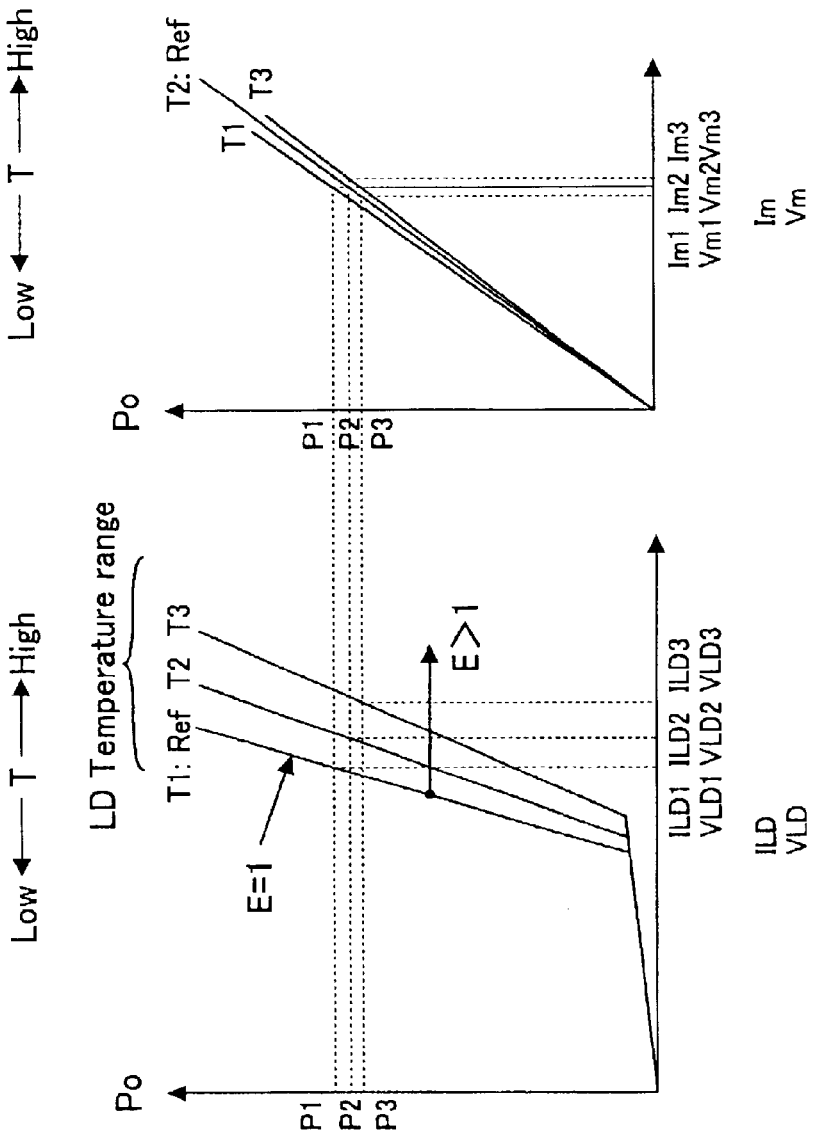

Referring to FIGS. 40A and 40B, the amplification factor C of the amplifier 121 or 124 is set to 1 at the temperature T1 while the amplification factor C is increased as the temperature of the laser diode LD increases from the temperature T1 to T2 or T3.

With such an increase of the amplification factor C, the decrease of slope in the relationship of FIG. 40B representing the detected optical output power Po of the laser diode LD and the monitoring current Im detected by the photodetector PD is effectively compensated for. Thereby, high-precision temperature compensation becomes possible for the laser diode LD even in the case there is a large temperature change in the drive current ILD for the laser diode LD.

It should be noted that a similar temperature compensation is possible also for the driver circuit of FIG. 36 or 37 when setting the voltage shift E.

<Ninth Mode of the Third Embodiment>

Next, a ninth mode of the present embodiment will be explained with reference to FIGS. 41A and 41B, wherein the present mode is based on the construction of FIG. 34 or 35 and sets the reference temperature corresponding to the reference temperature signal VLD0 to be generally at the upper edge temperature (T3) of the operational temperature range of the laser diode LD. Further, the present mode defines the maximum value of the amplification factor C to be equal to one at the foregoing upper limit temperature T3.

Referring to FIGS. 41A and 41B, the amplification factor C of the amplifier 121 or 124 is set to 1 at the temperature T3 while the amplification factor C is decreased as the temperature of the laser diode LD decreases from the temperature T3 to T2 or T1.

With such a decrease of the amplification factor C, the increase of slope in the relationship of FIG. 41B representing the detected optical output power Po of the laser diode LD and the monitoring current Im of the photodetector PD is effectively compensated for. Thereby, a high-precision temperature compensation becomes possible for the laser diode LD even in the case there is a large temperature change in the drive current ILD for the laser diode LD.

It should be noted that a similar temperature compensation is possible also for the driver circuit of FIG. 36 or 37 when setting the voltage shift E.

<Tenth Mode of the Third Embodiment>

Next, a ninth mode of the present embodiment will be explained with reference to FIG. 42, wherein those parts corresponding to the parts described previously are designated by the same reference numerals and the description thereof will be omitted.

Figure 42:
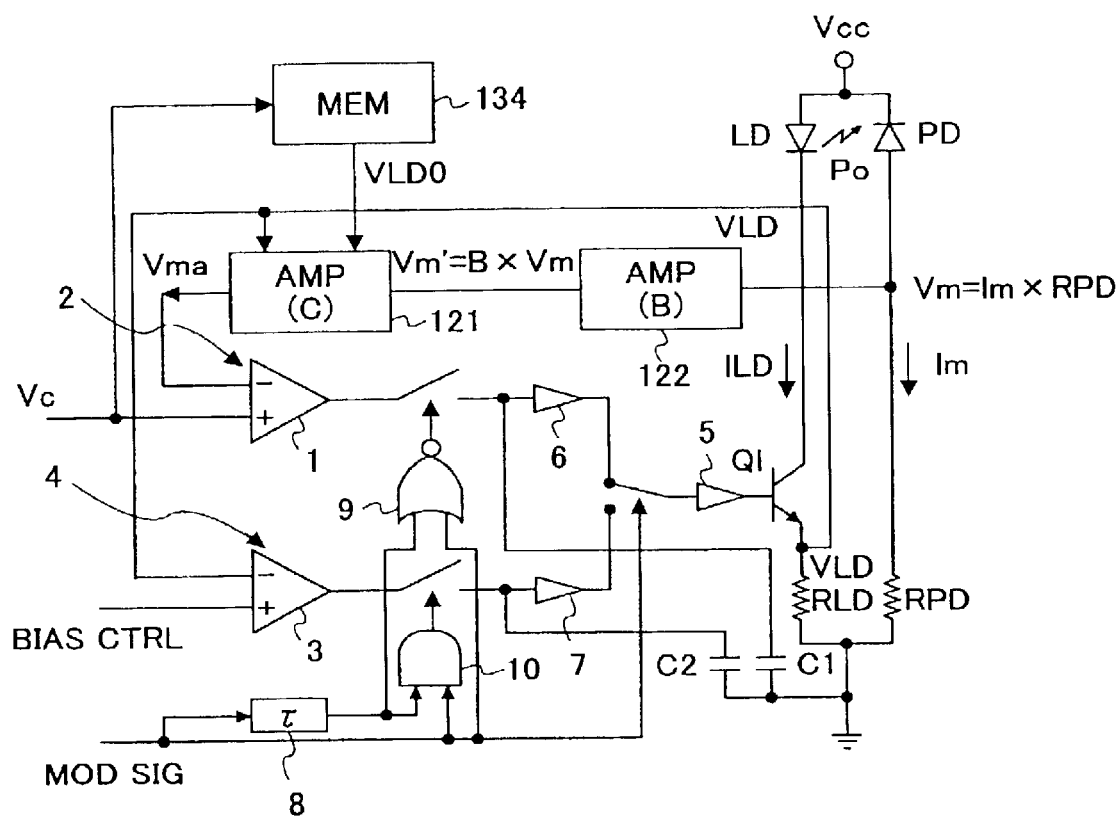
FIG. 42 is a diagram showing another construction mode of a laser driver circuit according to the third embodiment of the present invention.

Referring to FIG. 42, the laser driver circuit of the present mode holds the relationship between the laser drive operational voltage VLD and the optical-emission control signal Vc for various temperatures T in a memory buffer 134, wherein the data of the operational voltage VLD is read out from the memory buffer 134 in response to the incoming optical-emission control signal Vc, and the data of the operational voltage VLD thus read out for the reference temperature is used for the reference temperature voltage signal VLD0. Thus, by using the reference temperature voltage signal VLD0 and the operational voltage VLD, the amplification factor C of the amplifier 121 is set up.

By using such a memory buffer 134, it becomes possible to obtain the reference temperature voltage signal VLD0 at the temperature T for a given optical-emission level control signal Vc used for correcting the optical emission level. When the temperature of the laser diode has been changed, the temperature difference with respect to the reference temperature is detected from the difference of VLD0−VLD. Assuming that the differential quantum efficiency does not depend on the operational temperature, an amplification factor C' is calculated from the temperature change of the operational voltage VLD for the state in which the optical output power P takes a value P0 and the optical-emission control signal Vc takes a value Vc0.

Actually, there is caused a change of differential quantum efficiency η with temperature, and thus, the contribution of the differential quantum efficiency η for the amplification factor C is obtained by obtaining the variation of differential quantum efficiency from the value of the optical-emission control signal Vc, assuming that the contribution C" of the differential quantum efficiency to the amplification factor ° C. takes the value 1 when Vc=Vc0.

Thus, in the case Vc is smaller than Vc0, a correction is made by assuming that C"<1. In the case Vc is larger than Vc0, on the other hand, the correction is made by assuming that C">1.

Thus, in the amplifier 121, the amplification factor C' and C" are determined, and the total amplification factor C is determined as C=C'×C".

According to the correction scheme outline above, it becomes possible to achieve a high-precision correction in the operational characteristics of the laser diode LD.

It should be noted that the temperature compensation explained above is also applicable for the laser driver circuit of FIG. 36 or 37.

<Eleventh Mode of the Third Embodiment>

Figure 43:
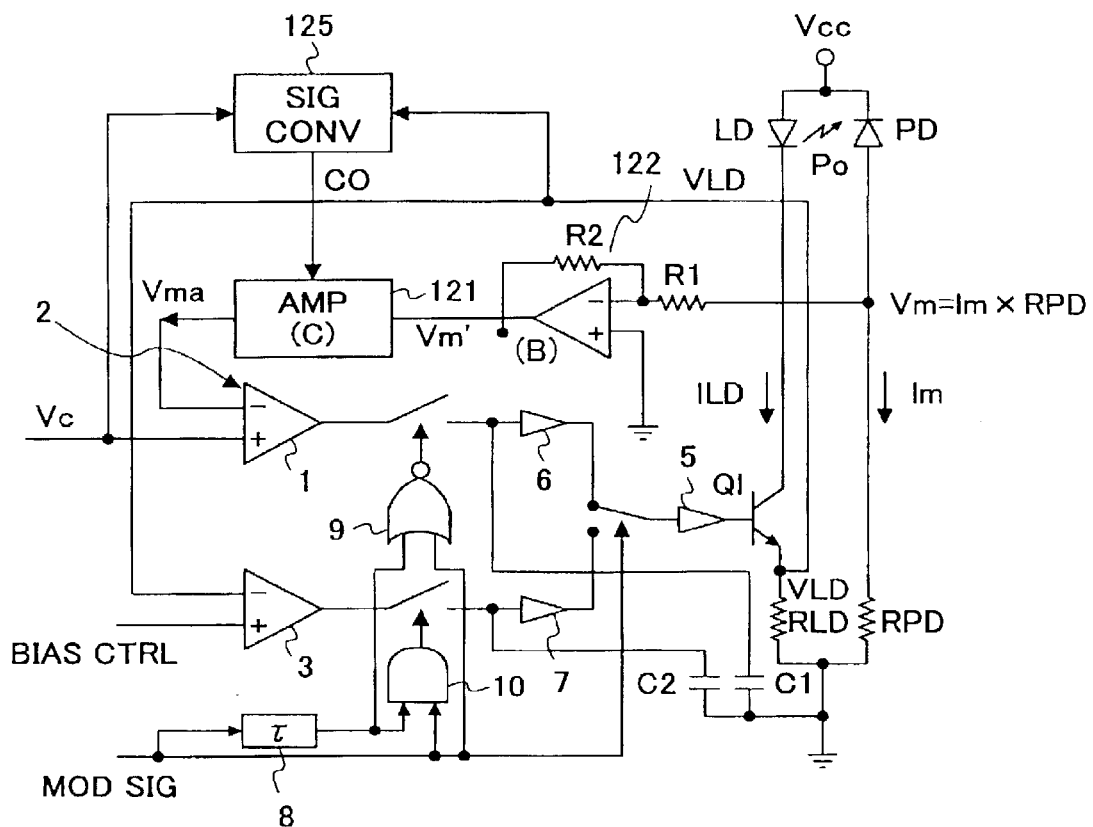
FIG. 43 is a diagram showing another construction mode of a laser driver circuit according to the third embodiment of the present invention.

FIG. 43 shows the construction of a laser driver circuit according to an eleventh mode of the third embodiment, wherein those parts corresponding to the parts described previously are designated by the same reference numerals and the description thereof will be omitted.

Referring to FIG. 43, the laser driver circuit is based on the laser driver circuit of FIG. 34 or 35, wherein the amplification factor C of the amplifier 121 is set by a signal converter 125, wherein the signal converter 125 determines the amplification factor C from the operational voltage VLD of the laser diode and the control voltage Vc.

Figure 44:
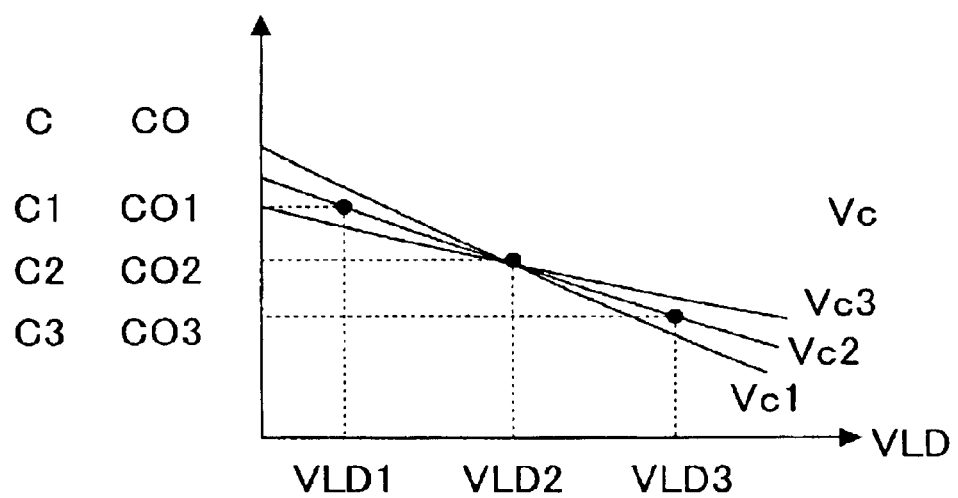
FIG. 44 is a diagram explaining the operation of the laser driver circuit of FIG. 43.

FIG. 44 explains the operation of the signal converter 125.

Referring to FIG. 44, the signal converter 125 holds the relationship between the signal amplification setup signal Co setting up the amplification factor C of the amplifier 121 and the laser operational voltage VLD in the form of a linear equation passing the point defined by the laser operational voltage VLD2 and the signal amplification setup signal Co2 corresponding to the amplification factor C2, wherein the gradient of the line is determined by the optical-emission control voltage Vc.

Thus, when the optical-emission control signal Vc2 is provided at the temperature T2 and the operational voltage of VLD is obtained for the laser diode LD, the amplification factor C of the amplifier 125 is set to C2 via the setup signal Co2.

When the temperature of the laser diode has decreased from T2 to T1 in this state, the operational voltage VLD is reduced to the voltage VLD1, and the optical output is increased to P1 as explained before. Thereby, the amplification factor of the amplifier 121 is increased according to the relationship of FIG. 44 and the monitoring voltage Vm is controlled to the voltage Vm1. Thereby, the output optical power of P2 is recovered for the laser diode LD.

In the event the optical-emission control signal Vc is changed from Vc2 to Vc1, on the other hand, it is judged that the temperature of the laser diode LD is lower than the reference temperature T2 in the case the operational voltage VLD is smaller than the operational voltage VLD2, and the amplification factor C is controlled to have a value larger than C2. In the case the operational voltage VLD is larger than the operational voltage VLD2, on the other hand, it is judged that the temperature T of the laser diode LD is higher than the reference temperature T2 and the amplification factor C is reduced as compared with the amplification factor C2.

In this way, the amplification factor C is determined by the signal conversion circuit 125 from the laser operational voltage VLD and the optical-emission level control signal Vc and the laser driver circuit of the present embodiment can perform a high precision control of optical emission level at the output optical power specified by the optical-emission control signal Vc.

While not illustrated, the signal conversion circuit 125 of the present embodiment is useful also in the construction of FIG. 29 for setting up the amplification factor A or in the construction of FIGS. 36 and 37 for setting up the voltage shift E.

Further, the present invention is by no means limited to the embodiments described heretofore, but various variations and modifications may be made without departing from the scope of the invention.

What is claimed is:

1. A laser driver circuit, comprising:
   a biasing current source for supplying a bias current to a laser diode continuously with a level such that no laser oscillation is caused in said laser diode;
   a threshold current source for supplying a threshold current to said laser diode with a level causing optical emission but not causing substantial laser oscillation in said laser diode; and
   a modulation current source for supplying a modulation current to said laser diode in response to an input signal such that a laser oscillation occurs in said laser diode in response to said modulation current,
   wherein said threshold current source produces said threshold current in response to said input signal with a timing of 1–10 ns in advance of a leading edge of said modulation current and with an interval of said threshold current exceeding an interval of said modulation current such that said interval of said threshold current includes said interval of said modulation current,
   said laser driver circuit driving said laser diode by a sum of said bias current, said threshold current and said modulation current.

2. A laser driver circuit as claimed in claim 1, wherein said bias current is a minimum current that produces a voltage drop of 1.0–1.5V across said laser diode.

3. A laser driver circuit as claimed in claim 1, wherein said biasing current source produces said bias current with a magnitude of several milliamperes or less.

4. A laser driver circuit as claimed in claim 1, further comprising a delay circuit for delaying said input signal for a predetermined delay time to produce a delayed signal, said modulation current source driving said laser diode with said modulation current in response to said delayed signal, and said threshold current source producing a logic sum of said input signal and said delayed signal and producing said threshold current in response to said logic sum, such that said threshold current is not turned off before said modulation current is turned off.

5. A laser driver circuit as claimed in claim 1, wherein said modulation current source includes an initialization circuit operated upon any of throwing of electric power to said laser driver circuit or cancellation of a reset state of said laser driver circuit, said initialization circuit setting an optical power of said laser diode at the time of an activated state thereof, to a predetermined initial value.

6. A laser driver circuit as claimed in claim 5, wherein said initialization circuit detects a difference of an electric quantity between a first case in which said laser diode is producing a predetermined optical power and a second case in which said laser diode is producing an optical power smaller than said predetermined optical power, said electric quantity being one of an electric current flowing through said laser diode and a voltage appearing across said laser diode, and said initialization circuit further setting said laser driver circuit such that said laser diode produces said predetermined optical power when said laser diode has caused laser oscillation.

7. A laser driver circuit as claimed in claim 6, wherein said initializing circuit comprises a timing circuit producing a timing signal, a detector detecting said difference in response to said timing signal, a current setup circuit setting up said output optical power of said laser diode in a duration in which said laser diode is driven to cause laser oscillation, and a comparator comparing an output of said detector and said output optical power set up by said current setup circuit consecutively in response to said timing signal.

8. A laser driver circuit as claimed in claim 5, wherein said initialization circuit detects a difference of an electric quantity between a first case in which said laser diode is producing a predetermined optical power and a second case in which said laser diode is causing an offset optical emission, said electric quantity being one of an electric current flowing through said laser diode and a voltage appearing across said laser diode, and said initialization circuit further setting said laser driver circuit such that said laser diode produces said predetermined optical power when said laser diode has caused laser oscillation.

9. A laser driver circuit as claimed in claim 5, wherein said initialization circuit detects a difference of an electric quantity between a first case in which said laser diode is producing a predetermined optical power and a second case in which said laser diode is producing an optical power of 1/N (N being a natural number equal to or larger than 2) times said predetermined optical power, said electric quantity being one of an electric current flowing through said laser diode and a voltage appearing across said laser diode, and said initialization circuit further setting said laser driver circuit such that said laser diode produces said predetermined optical power when said laser diode has caused laser oscillation.

10. A laser driver circuit as claimed in claim 1, further comprising:
   a photodetector detecting an optical output of said laser diode; and
   a current control circuit controlling a supply of a current to said laser diode in response to an output of said photodetector.

11. A laser driver circuit as claimed in claim 10, wherein said current control circuit compares said output of said photodetector with a given value and produces a control signal as a result of comparison, said current control circuit controlling said threshold current circuit by said control signal.

12. A laser driver circuit as claimed in claim 11, wherein said current control circuit samples said control signal at a time said laser driver circuit is on to produce a sampled control signal, and wherein said current control circuit controls said threshold current circuit in response to said sampled control signal.

13. A laser driver circuit as claimed in claim 1, further comprising a power voltage control circuit detecting a voltage of a power supply supplying electric power to said laser diode, said power voltage control circuit controlling an output voltage of said power supply in response to a result of said detection.

14. The laser diode as claimed in claim 1, wherein said biasing current source supplies said bias current of about 1 mA.

15. An image forming apparatus, comprising:

a laser diode; a laser driver circuit driving said laser diode in response to an image modulation signal, such that said laser diode produces a laser beam modulated in response to said image modulation signal; a rotary photosensitive body; and a scanning mechanism scanning said rotary photosensitive body with said laser beam, said rotary photosensitive body being recorded with an electrostatic latent image with said laser diode, said laser driver circuit comprising:

a biasing circuit for supplying a bias current to said laser diode continuously with a level such that no laser oscillation is caused in said laser diode;

a threshold current circuit for supplying a threshold current to said laser diode with a level causing optical emission but not causing substantial laser oscillation in said laser diode; and a drive circuit for supplying a drive current to said laser diode in response to said image modulation signal such that there occurs a laser oscillation in said laser diode, wherein said threshold current circuit produces said threshold current in response to said image modulation signal with a timing of 1–10 ns in advance of a leading edge of said drive current and with an interval of said threshold current exceeding an interval of said laser oscillation and such that said interval of said threshold current includes said interval of said laser oscillation, said laser driver circuit driving said laser diode by a sum of said bias current, said threshold current and said drive current.

16. An image forming apparatus as claimed in claim 15, further comprising a shading correction unit changing a full scale value of said threshold current circuit with scanning of said scanning mechanism.

17. A laser driver circuit comprising:

a biasing current source for supplying a bias current to a laser diode continuously with a level not causing laser oscillation in said laser diode;

a threshold current source for supplying a threshold current to said laser diode with a level not causing substantial laser oscillation in said laser diode;

a modulation current source for supplying a modulation current to said laser diode in response to an input signal such that there occurs a laser oscillation in said laser diode in response to said modulation current; and an auxiliary modulation current source for supplying an auxiliary modulation current to said laser diode, said auxiliary modulation current source producing said auxiliary modulation current in response to a leading edge of said modulation current, said laser driver circuit driving said laser diode by a sum of said bias current, said threshold current, said modulation current and said auxiliary modulation current, wherein said threshold current source produces said threshold current in response to said input signal with an ON interval exceeding an ON interval of said laser diode caused by said modulation current such that said ON interval of said threshold current includes said ON interval of said laser diode.

18. A laser driver circuit as claimed in claim 17, wherein said laser driver circuit further comprises:

a first delay circuit delaying said input signal to produce a first delay signal, said first delay circuit driving said modulation current source with said first delay signal;

a threshold current producing circuit producing said threshold current from said input signal and said first delay signal;

a second delay circuit delaying said first delay signal to produce a second delay signal; and an auxiliary modulation signal circuit driving said auxiliary modulation current source with said first and second delay signals.

19. A laser driver circuit as claimed in claim 18, wherein a first delay caused in said first delay circuit and a second delay caused in said second delay circuit are set independently.

20. A laser driver circuit as claimed in claim 18, wherein said laser driver circuit further comprises:

a delay circuit delaying said input signal to produce a delay signal, said delay circuit driving said modulation current source with said delay signal;

a threshold current producing circuit producing said threshold current from said input signal and said delay signal; and a differential circuit differentiating said delay signal to form a differential pulse, said differential circuit driving said auxiliary modulation current source with said differential pulse.

21. A laser driver circuit as claimed in claim 18, wherein said auxiliary modulation current source produces said auxiliary modulation current with a first magnitude proportional to a second magnitude of said modulation current.

22. A laser driver circuit as claimed in claim 21, wherein said first magnitude of said auxiliary modulation current is smaller than said second magnitude of said modulation current.

23. A laser driver circuit as claimed in claim 18, wherein said auxiliary modulation current continues for a duration of 5 ns or less.

24. An image forming apparatus, comprising:

a laser diode; a laser driver circuit driving said laser diode in response to an image modulation signal, such that said laser diode produces a laser beam modulated in response to said image modulation signal; a rotary photosensitive body; and a scanning mechanism scanning said rotary photosensitive body with said laser beam, said rotary photosensitive body being recorded with an electrostatic latent image with said laser diode, said laser driver circuit comprising:
- a biasing circuit for supplying a bias current to a laser diode continuously with a level not causing laser oscillation in said laser diode;
- a threshold current circuit for supplying a threshold current to said laser diode with a level not causing substantial laser oscillation in said laser diode;
- a drive circuit for supplying a drive current to said laser diode in response to said image modulation signal such that there occurs laser oscillation in said laser diode; and
- an auxiliary drive circuit supplying an auxiliary drive current to said laser diode such that said auxiliary drive current is supplied to said laser diode simultaneously with turning-on of said drive current and continued for a predetermined interval,
- said threshold current circuit producing said threshold current in response to said image modulation signal such that an interval in which said threshold current is turned on is longer than an interval of laser oscillation of said laser diode and such that said interval in which said threshold current is turned on includes said interval of laser oscillation of said laser diode,
- said laser driver circuit driving said laser diode by a sum of said bias current, said drive current, said threshold current and said auxiliary drive current.

25. A laser control circuit, comprising:
- a first opto-electronic negative feedback loop including a first error amplifier, said first error amplifier controlling a forward bias current supplied to a laser diode such that an optical emission level monitoring signal obtained by a monitoring photodetector in proportion with an optical output of said laser diode becomes equal to an optical emission level control signal;
- a second opto-electronic negative feedback loop including a second error amplifier, said second error amplifier controlling said forward bias current such that an emitter voltage level of a drive transistor, having a collector connected to said laser diode and a base supplied with a forward bias current signal of said laser diode, becomes equal to an optical extinction level control voltage when said laser diode is in an extinction state;
- a signal amplifier amplifying said optical emission monitoring signal produced by said monitoring photodetector;
- a current driver unit switching said forward bias current between an optical emission state and an optical extinction state of said laser diode in response to a modulation signal; and
- a sample-hold circuit including a peak hold circuit holding an optical emission level signal produced by said first error amplifier and a bottom hold circuit holding an optical extinction level signal produced by said second error amplifier,
- said laser control circuit controlling driving of said laser diode by using one of said optical emission level signal held in said peak hold circuit and said optical extinction level signal held in said bottom hold circuit when said modulation signal takes an identical state continuously for a predetermined interval,
- said signal amplifier having a variable amplification factor, said variable amplification factor of said signal amplifier being determined in response to a reference temperature signal and a laser operational voltage of said laser diode.

26. A laser driver circuit as claimed in claim 25, wherein said signal amplifier comprises a first amplifier circuit amplifying said optical emission level monitoring signal with a predetermined constant amplification factor and a second amplifier circuit, said second amplifier circuit amplifying an output signal of said signal amplifier with an amplification factor set in response to said reference temperature signal and said laser operational voltage.

27. A laser driver circuit as claimed in claim 26, wherein said amplification factor of said second amplifier circuit is set to one when a difference between said reference temperature signal and said laser operational voltage is zero, said amplification factor of said second amplifier circuit being set to a value other than one when said difference between said reference temperature signal and said laser operational voltage is not zero.

28. A laser driver circuit as claimed in claim 26, wherein said amplification factor of said second amplifier circuit is set to one when a difference between said reference temperature signal and said laser operational voltage takes any of maximum and minimum, said amplification factor of said second amplifier circuit being set variably to a value smaller then one or larger than one in response to a value of said difference.

29. A laser driver circuit as claimed in claim 25, wherein said signal amplifier comprises an amplifier circuit amplifying said optical emission level monitoring signal with a predetermined constant amplification factor and a voltage shifter circuit shifting an output signal of said signal amplifier with a voltage shift set in response to said reference temperature signal and said laser operational voltage.

30. A laser driver circuit as claimed in claim 29, wherein said voltage shift of said voltage shifter circuit is set to zero when a difference between said reference temperature signal and said laser operational voltage takes any of maximum and minimum, said voltage shift of said voltage shifter circuit being set variably to a positive value or a negative value in response to a value of said difference.

31. A laser driver circuit as claimed in claim 29, wherein said voltage shift of said voltage shift circuit is set to zero when a difference between said reference temperature signal and said laser operational voltage is zero, said voltage shift of said voltage shifter circuit being set to a value other than zero when said difference between said reference temperature signal and said laser operational voltage is not zero.

* * * * *